US011295925B2

United States Patent
Yasuda et al.

(10) Patent No.: US 11,295,925 B2
(45) Date of Patent: Apr. 5, 2022

(54) ELECTRON GUN DEVICE

(71) Applicant: Param Corporation, Tokyo (JP)

(72) Inventors: Hiroshi Yasuda, Tokyo (JP); Yoshihisa Ooae, Tokyo (JP); Tatsuya Shibaoka, Tokyo (JP); Hidekazu Murata, Aichi (JP)

(73) Assignee: Param Corporation, Tokyo (JP)

( * ) Notice: Subject to any disclaimer, the term of this patent is extended or adjusted under 35 U.S.C. 154(b) by 0 days.

(21) Appl. No.: 17/434,833

(22) PCT Filed: Jul. 13, 2020

(86) PCT No.: PCT/JP2020/027255
§ 371 (c)(1),
(2) Date: Aug. 30, 2021

(87) PCT Pub. No.: WO2021/015039
PCT Pub. Date: Jan. 28, 2021

(65) Prior Publication Data
US 2022/0051866 A1 Feb. 17, 2022

(30) Foreign Application Priority Data
Jul. 23, 2019 (JP) .............................. JP2019-135618

(51) Int. Cl.
*H01J 37/073* (2006.01)
*H01J 37/065* (2006.01)
(Continued)

(52) U.S. Cl.
CPC .............. *H01J 37/073* (2013.01); *H01J 1/05* (2013.01); *H01J 37/065* (2013.01); *H01J 37/305* (2013.01)

(58) Field of Classification Search
CPC .......... H01J 37/06; H01J 37/065; H01J 37/07; H01J 37/073; H01J 37/305; H01J 1/05
See application file for complete search history.

(56) References Cited

U.S. PATENT DOCUMENTS 4,088,919 A * 5/1978 Clampitt ................. H01J 27/26
250/423 F
4,721,878 A * 1/1988 Hagiwara ............. H01J 27/022
313/336

FOREIGN PATENT DOCUMENTS

JP S58-046542 A 3/1983
JP S58-038905 B2 8/1983
(Continued)

OTHER PUBLICATIONS

International Search Report for Application No. PCT/JP2020/027255, dated Sep. 29, 2020, with English translation (5 pages).
(Continued)

*Primary Examiner* — David E Smith
(74) *Attorney, Agent, or Firm* — Nixon Peabody LLP

(57) ABSTRACT

An electron gun device according to the present invention emits an electron beam by means of heating to a high temperature in a vacuum. According to the present invention, the surface of a material (108, 125), which emits an electron beam, is a hydrogenated metal that is melted and in a liquid state during a high-temperature operation; the liquid hydrogenated metal is contained in a hollow cover tube container (102, 124), which is in a solid state during the high-temperature operation, in the form of a hydrogenated liquid metal or in the form of a liquid metal before hydrogenation, and heated together with the cover tube container (102, 124) to a high temperature; subsequently, the hydrogenated liquid metal is exposed from the cover tube container (102, 124) and forms a liquid surface where gravity, the electric field and the surface tension of the liquid surface are balanced; and an electron beam is emitted from the exposed surface of the hydrogenated liquid metal.

18 Claims, 15 Drawing Sheets

(51) Int. Cl.
*H01J 1/05* (2006.01)
*H01J 37/305* (2006.01)

(56) References Cited

FOREIGN PATENT DOCUMENTS

| | | |
|---|---|---|
| JP | S62-140340 A | 6/1987 |
| JP | H02-195640 A | 8/1990 |
| JP | H03-233826 A | 10/1991 |
| JP | H03-272500 A | 12/1991 |
| JP | 5595199 B2 | 9/2014 |

OTHER PUBLICATIONS

Written Opinion of International Searching Authority for Application No. PCT/JP2020/027255, dated Sep. 29, 2020; English translation unavailable (3 pages).

\* cited by examiner

ELECTRON GUN DEVICE

CROSS-REFERENCE TO RELATED APPLICATIONS

This application is a U.S. National Stage of International Application No. PCT/JP2020/027255, filed Jul. 13, 2020, which is related to and claims the benefit and priority of Japanese Patent Application No. 2019-135618, filed Jul. 23, 2019, the contents of which are incorporated herein in their entireties by reference.

TECHNICAL FIELD

The present invention relates to an electron gun device used in an electron beam writing apparatus, an X-ray generator, an electron beam welder, an electron microscope, and the like.

BACKGROUND

An electron gun is a source that generates an electron beam, and is used for the following applications.
1) Electron Beam Writing Apparatus In a semiconductor manufacturing factory or a factory for manufacturing a mask of a light exposure apparatus, an electron beam writing apparatus is used to form a pattern on a glass dry plate. Since no other technique can generate a pattern, an electron gun for generating an electron beam is necessary. In the world market, about 20 electron guns are manufactured per year for this purpose.
2) Electron Beam Pattern Direct Writing Device for Development and Manufacturing.

Electron beam direct writing is used for various applications. An electron beam direct writing device is used for semiconductor devices and a micro MEMS prototype.

About hundreds of electron beam direct writing devices are manufactured per year. Here, MEMS is an abbreviation of "micro electro mechanical systems", and refers to a device having a micron level structure in which a sensor, an actuator, an electronic circuit, and the like of a mechanical component are integrated into a silicon substrate, a glass substrate, an organic material, and the like of a semiconductor.
3) X-Ray Generating Device An electron gun is necessary for various X-ray generating devices for medical and industrial use. An X-ray device is used in many fields such as human body transmission photographs and CT devices in hospitals, tests on internal structures of devices in industry, and examinations of baggage and the like.
4) Electron Beam Welder or Three-Dimensional Molding Device An electron beam welder or a three-dimensional molding device is used for precise welding for applications such as joining metals of different materials to each other within a vacuum. In recent years, an electron beam is used in the three-dimensional molding device and the like.
5) Electron Microscope.

An electron microscope is used as an electron gun for various electron microscopes for semiconductor inspection observation and various applications in research and development. An entire electron microscope device has a market of hundreds of million yen. It is considered that the electron gun device of the present disclosure may not be applied to an inexpensive device of millions of yen or less as the electron microscope device.

Although various materials have been used as electron emission materials (=electron gun materials), an electron gun is generally divided into two types, a thermal electron emission tungsten electron gun and a thermal electron emission $LaB_6$ electron gun. Hereinafter, "$LaB_6$" will be referred to as "LaB6".

The tungsten electron gun is inexpensive (about 1000 yen per gun) and can be easily used for a lifetime of 1000 hours. The tungsten electron gun has a low luminance of about $10^4$ A/cm$^2$ steradian at 50 kV. A usage temperature is about 2500° C.

The LaB6 electron gun is expensive, for example, 200,000 to 500,000 yen per gun, and has a high luminance of $10^6$ A/cm$^2$ steradian at 50 kV. However, an evaporation rate of this material varies depending on the usage temperature, and the evaporation consumption is several tens of μm in 1000 hours from 1550° C. to 1600° C. Accordingly, there is a large disadvantage that a lifetime becomes shorter as the luminance becomes higher.

Here, a LaB6 crystal, which is an electron emission material, is consumed by use. When the LaB6 crystal is consumed, a shape of the LaB6 crystal is changed, and a desired electron beam emission cannot be performed. When a temperature of the LaB6 crystal is high, an evaporated substance of the LaB6 material is deposited on a surface of a heater for heating and a resistance value of the heater is lowered. When the same heating current is passed, the temperature of the LaB6 crystal is lowered.

In order to prevent evaporation from a side surface of the LaB6 crystal, there has also been proposed formation of a cover made of a carbon film or a high melting point metal film. Although the cover made of the carbon film or the high melting point metal film remains without changing a shape even after the electron gun is used for a long period of time, an upper surface of the LaB6 crystal is greatly consumed and is retracted into an inner surface of the cover. For this reason, an intensity distribution of the electron beam emitted from a top end of the LaB6 crystal shows a high intensity, and an irradiation uniformity in a central portion is good at the start of use, and on the other hand, in an electron beam radiation distribution by the upper surface of the LaB6 crystal after long-term use, a total current becomes small, and a uniformity of an electron radiation distribution also becomes narrow and deteriorates.

The above circumstance is shown in PTL 1 (JP 5595199 B) in which the top end LaB6 crystal of the electron gun is consumed by use for several hundred hours, and a top end surface is formed into a shape of a round mountain from a flat surface. It has been pointed out that, since an electron beam having the same electron beam emission intensity cannot be emitted from the top end of the electron gun consumed in such a manner, not only can the electron gun not be used as a stable electron gun, but also a uniformity distribution of the irradiated electron beam changes, which is a major problem. The present inventors have also faced the same problem over a period of 30 years or more. That is, in order to increase the luminance, a high temperature is required, and an electron gun shape changes in a short time due to consumption of the surface of the LaB6 crystal, resulting in shortened lifetime. Unless this problem can be overcome, no development of the electron gun can be expected in the future.

CITATION LIST

Patent Literature

PTL 1: JP 5595199 B

SUMMARY

Technical Problem

As described above, it is desired to simultaneously achieve a high luminance of the electron gun, stabilization of the heater temperature, and an extended lifetime of the electron gun. In particular, regarding the lifetime, it is desired that an extended lifetime of one year or more can be achieved.

Solution to Problem

In an electron gun device configured to emit an electron beam by being heated to a high temperature in vacuum according to the present invention, a surface of a material that emits the electron beam is a liquid hydrogenated metal dissolved during a high-temperature operation, and the liquid hydrogenated metal is stored as a hydrogenated liquid metal or a liquid metal before hydrogenation in a hollow cover tube container which is solid during a high-temperature operation, is heated to the high temperature together with the cover tube container, and the hydrogenated liquid metal is exposed from the cover tube container to form a liquid surface on which gravity, an electric field, and a surface tension of the liquid surface are balanced, and the electron beam is emitted from an exposed surface of the hydrogenated liquid metal.

The electron gun according to the present invention is preferably configured as follows.

In the electron gun that emits an electron beam by being heated to a high temperature of 1000° C. or more and 1600° C. or less in vacuum 1) the material that emits the electron beam is a metal hydride that dissolves into liquid at the time of high temperature operation, and a work function of the metal material in a non-hydrogenated state is reduced by hydrogenation to increase an electron emission intensity and prevent oxidation of the material at the time of exposure to air or oxygen gas, 2) the liquid metal hydride is stored in the hollow cover tube container which is solid at the time of high-temperature operation and is heated to a high temperature together with the container, the hollow cover tube container is made of a material that does not dissolve by chemical reaction with the liquid metal hydride that is the electron beam emitting material at the same high temperature, and the hollow cover tube container has conductivity, 3) by bonding a hydrogen atom to a liquid metal atom, the work function originally possessed by the liquid metal atom is reduced, and thereby an electron emission is increased, the vapor pressure of the liquid metal to vacuum at the high temperature is $10^1$ pascal to 1 pascal 4) a surface of the hydrogenated liquid metal is exposed from the cover tube container to form a liquid surface on which gravity, an electric field, and a surface tension of the liquid surface are balanced 5) thermoelectrons or electric-field-applied thermoelectrons are emitted in the upward direction of gravity or in a downward direction to the direction of gravity.

Advantageous Effects of Invention

According to the present invention, a high luminance of the electron gun, stabilization of the heater temperature, and an extended lifetime of the electron gun can be simultaneously achieved.

DESCRIPTION OF EMBODIMENTS

[Process of the Invention]

Figure 1A:
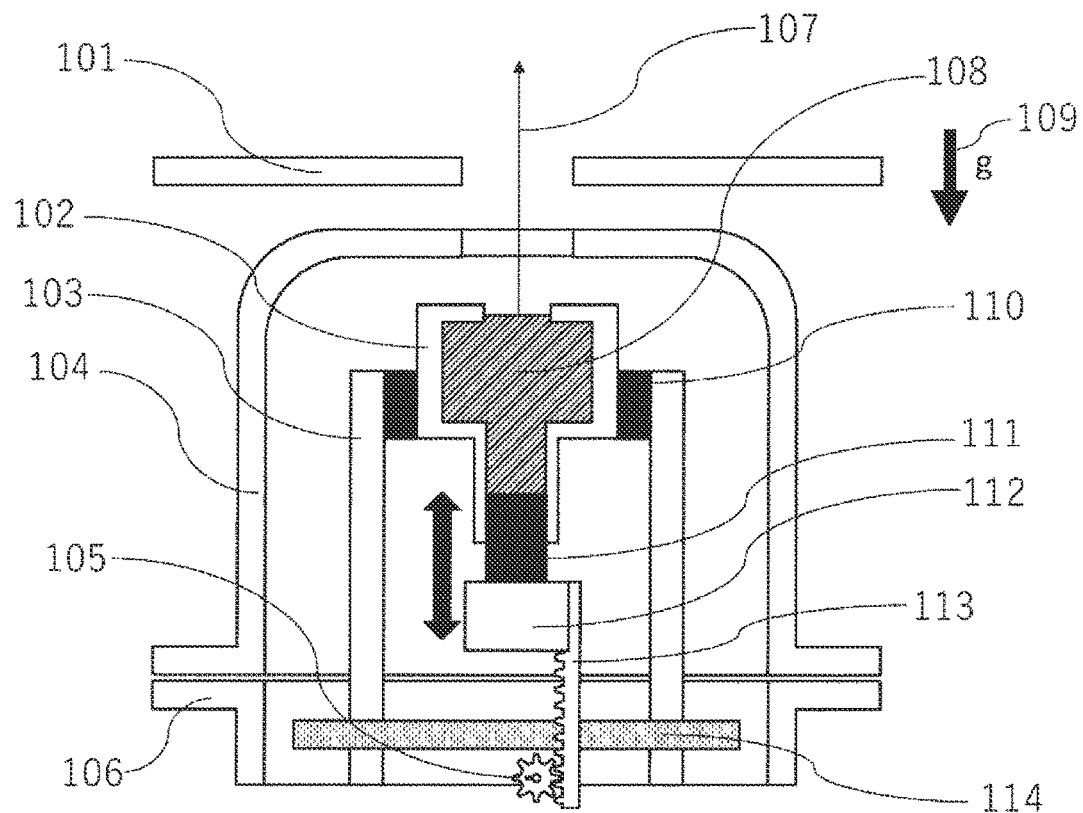
FIG. 1A is a view showing an embodiment of the present invention and shows a case where an electron emission surface faces a upward direction of gravity.

The present inventors have discovered a phenomenon that, when an electron gun of a LaB6 single crystal is heated at a high temperature and a hydrocarbon-based adhesive having a long chain of hydrocarbon (n-$CH_2$) is used, the electron gun suddenly has luminance an order of magnitude higher at a normal operation temperature of 1500° C. of the LaB6, and the luminance does not change even when the electron gun is operated at 1200° C. after a drop in temperature of 300° C. However, difficulty was encountered in obtaining stability and controllability of the adhesive.

Therefore, the method was switched to supplying hydrocarbons with a gas. A reason why the gas was used is that it is easy to control the gas from outside by pressure and a flow rate of the gas. A type of the gas is methane gas CH4. This is the simplest hydrocarbon gas. Although the LaB6 single crystal usually requires a high temperature of 1500° C. or higher, when the LaB6 crystal is left at 1200° C. and methane gas of $10^{-4}$ pascal flow to and fills an inside of a vacuum chamber of the electron gun, an electron generation intensity at about 1500° C. of the LaB6 single crystal could be achieved after 5 hours. A reason for this is that methane gas acts to destroy a lattice of boron(B) in LaB6 and is drawn by a vacuum pump as a gas called diborane ($B_2H_6$). As a result, it was found that lanthanum atoms remained as liquid on a surface of LaB6 and generated electrons as lanthanum liquid. It was also found that lanthanum hydride was formed by the generation of the lanthanum liquid by the methane gas and hydrogen in the methane. Carbon in the methane gas is useful for destroying a lattice of boron B. In a state in which the lanthanum liquid is formed, when the lanthanum liquid is left at 1200° C., a work function of LaB6 is significantly reduced to 2.1 eV to 2.0 eV from 2.6 eV, and thus an electron generation efficiency is increased by a factor of 100 times to 1000 times. Therefore, the lanthanum liquid can be used at a temperature of 300° C. lower.

Since lanthanum is easily oxidized, a thin lanthanum layer on the LaB6 crystal is likely to react with oxygen in the atmosphere to become lanthanum oxide when lanthanum is taken out into the atmosphere. Since a work function of lanthanum oxide is as high as 3.5 eV, an electron generation efficiency is poor even if it is evacuated again. For the above reasons, when lanthanum is hydrogenated, they are not easily oxidized even if they are taken out to the atmosphere. Therefore, when lanthanum hydrogenated are used, large emissions can be obtained again when they are put into vacuum again.

The present inventors found that a low work function of the $LaB_6$ by a steady flow of methane at 1200° C. is due to hydrogenated lanthanum LaHx, and that the same work function is obtained by dissolving a hydrogenated lanthanum in a hollow cover tube container.

"LaHx" used herein refers to one to three hydrogen atoms per lanthanum atom. X indicates that a value cannot be determined.

At the same time, the present inventors heated an ingot block of lanthanum in a tungsten boat in a vacuum and placed the ingot block in a hollow cover tube container to liquefy lanthanum. Even when this operation was performed in an electron gun chamber into which hydrogen gas was caused to flow, the same work function as that of lanthanum hydride of 2.1 eV to 2.0 eV was obtained.

Therefore, it has been found that the use of lanthanum hydride enables manufacture of an electron gun having a high luminance and a low temperature operation on a liquid surface. Since LaB6 on a solid surface at 1500° C. or higher evaporates and a shape of the solid surface changes, an electron emission amount and an electron emission distribution change in a short time, and thereby a usable condition is short and a lifetime is consequently short. The lifetime of LaB6 on a solid surface was about 1000 hours at 1550° C.

In a liquid electron gun, a shape of a liquid surface does not change with evaporation of an electron emission material, and only a total amount of the liquid changes.

Therefore, when an electron beam is emitted from a liquid electron gun surface facing a direction opposite to a direction of gravity; that is, in an upward direction, if a mechanism for controlling an upper liquid surface to be constant is provided to compensate for a decrease in the total amount of the evaporating liquid, it is possible to prevent a change in the height of the liquid surface, by using the liquid surface as a horizontal surface.

A case where the electron beam is emitted in a forward direction relative to the direction of gravity; that is, in a downward direction, is described. Most electron beam irradiation devices radiate the electron beam in the downward direction relative to gravity. In this case, lanthanum hydride, which is a material of the liquid electron gun, is held in a manner described below. A liquid lanthanum hydride is stored inside a solid hollow cover tube container. A hole is provided in a top end electron emission surface of the cover tube container. The cover tube has a substantially cylindrical shape or a trapezoidal cylindrical shape with a narrow top end.

A liquid metal material adheres to a side surface of the hollow cover tube container by a capillary phenomenon at the time of high-temperature heating, and thereby the liquid does not flow downward even though a lowermost surface of the top end portion of the cover tube is opened. When the lanthanum liquid is used as the electron gun, a surface of liquid metal is determined in balanced with gravity, electric field, and surface tension, which is a static and substantially flat surface due to surface tension, is formed in the opening in the lowermost surface of the cover tube. A voltage is applied to an electrode, so a voltage is applied to the liquid surface, then electrons can be emitted from the liquid surface by heating.

As described above, the present inventors focused on a fact that, if the solid LaB6 is used, there is no method for preventing evaporation of the LaB6 crystal at the usage temperature, that the shape of the surface of the solid electron gun is unavoidably changed, and that avoiding a finite lifetime is difficult. For that purpose, we came up with an idea of liquefying the electron emission surface of the electron gun. When the electron emission surface is liquefied, a constant shape can be maintained even when the surface of the electron gun is evaporated. The lifetime is available until depletion of the total amount of the liquid.

Hereinafter, a mode (embodiment) for carrying out the present invention will be described with reference to drawings.

Figure 1B:
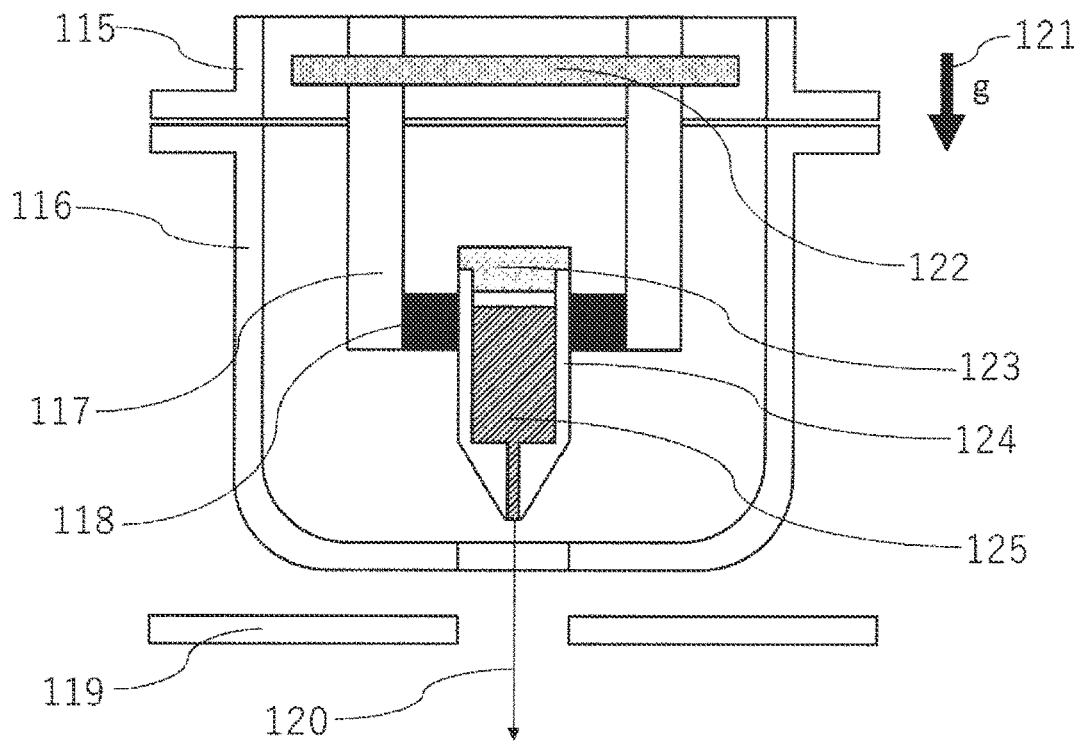
FIG. 1B is a view showing the embodiment of the present invention and shows a case where the electron emission surface faces the downward direction of gravity.

FIGS. 1A and 1B are views showing one embodiment of the present invention. FIG. 1A shows a liquid electron emission flat electron gun (a liquid surface of a liquid electron emission material 108 is in a direction perpendicular to the direction of gravity (gravity vector)) which emits an electron beam in a direction opposite to the direction of gravity (anti-gravity direction). The liquid electron emission material 108 is heated by a gripper 103 through which a current flows and a PG (pyrolytic graphite) heater 110, and is liquefied at a high temperature of 1000° C. to 1600° C. The material of the liquid electron gun is installed by a hollow cover tube container 102 in a manner of not leaking to the outside. Thermal electrons or a thermal field emission current is emitted as an electron beam 107 from an exposed surface of an upper portion of the liquid electron emission material. The emission current passes through an upper part of a Wehnelt electrode 104 that controls an electron emission amount, and is accelerated by an anode 101 to become the electron beam 107. As time passes, the liquid electron emission material evaporates, and thus a total amount of liquid decreases. However, although a shape of an upper surface of the liquid does not change, if the liquid is left as is, a height of an electron gun source changes because the liquid surface lowers as time passes. In order to prevent this, a pinion gear 105 periodically rotates, and pushes up a rack gear 113 that meshes with the pinion gear 105 and moves a piston 111 up and down. As a result, a support component 112 of the piston 111 is pushed up. As a result, since the piston 111 is pushed up, a shape and a position in a height direction of the upper surface of the liquid electron emission material are kept unchanged. As a result, a high luminance and an elongated lifetime are achieved at the same time. A potential of the Wehnelt electrode may be positive or negative. A potential of the anode is +1 kV to 100 kV or more in order to accelerate electrons. Reference numeral 114 denotes a ceramic disk of an electric insulator for fixing the gripper 103, reference numeral 106 denotes a lower portion of an electron emission amount controlling Wehnelt electrode, and reference numeral 109 denotes the direction of gravity.

FIG. 1B shows a liquid electron emission flat electron gun (the liquid surface of the liquid electron emission material 125 is in the direction perpendicular to the direction of gravity (gravity vector)), which emits an electron beam in a gravity forward direction. A liquid electron emission material 125 is heated by a gripper 117 through which a current flows and a PG (pyrolytic graphite) heater 118, and is liquefied at a high operation temperature of 1000° C. to 1600° C. The material of the liquid electron gun is installed by a hollow cover tube container 124 in a manner of not leaking to the outside. Thermal electrons or a thermal field emission current is emitted as an electron beam 120 from an exposed surface of a lower portion of the liquid electron emission material. The emission current passes through a lower portion of a Wehnelt electrode 116 that controls an electron emission amount, and is accelerated by an anode 119 to become the electron beam 120. The hollow cover tube container is formed of a material which is high melting point and does not chemically react with lanthanum metal. The material has a contact angle of 90 degrees or less with respect to a liquid metal at the time of high-temperature heating. The hollow cover tube covers a side surface of the electron beam emitting material facing a direction of a gravity axis, has an external shape of a prism, a column, or a truncated cone with the direction of gravity as a central axis, and has an internal shape of a prism, a column, an elliptic cylinder, an oval cylinder, or a truncated cone with the direction of gravity as a central axis. As time passes, the liquid electron emission material evaporates, and thus a total amount of liquid decreases. However, a shape of a lower surface of the liquid does not change. Gravity applied to a liquid metal, an electrostatic force due to a surface electric field by the electrode for extracting electrons, and a surface tension of the cover tube container and the liquid metal form a liquid surface of the liquid metal which is statically balanced, and a constant electron emission surface is maintained over a long period of time. However, at this time, a total amount of the liquid electron emission material 125 has a lower limit and an upper limit. The minimum limit value of a capacity of the liquid metal is $4\pi R^3/3$, where R is an average radius of a cylinder or a prism constituting an inner surface of a lowermost portion of the hollow cover tube; that is, a liquid amount is determined to have a capacity at least equal to the volume of a sphere that can adhere to the inner surface, and the liquid does not drip from an opening of the lower surface cover tube container. The upper limit of the liquid electron emission material 125 is determined such that, when a maximum radius of a cross section, in which an inside of the cover tube container has a largest inner diameter, is defined as r (cm), a contact angle between a cover tube material and the liquid metal material for electron emission is $\theta$ (degrees), the surface tension of the liquid metal is $\gamma LG$ (dyne/cm), a liquid metal density is $\rho$ (5 to 10 when density of water is 1), and an acceleration is 980 (g·cm/s$^2$: cgs unit system), a maximum limit value of a capacity of the liquid metal is set to be smaller than 4/5 of a height h of the liquid metal in the direction of gravity $h=2\gamma LG \times \cos(\theta(degrees))/(r \times \rho \times 980)$ (cm), and the liquid does not drip from the lowermost surface of the cover tube.

Here, it is preferable that the largest inner diameter of the cover tube container is 0.1 mm to 1 mm.

When the hollow cover tube is inclined with respect to gravity, the upper surface of the liquid metal faces the direction of gravity. and the liquid surface is perpendicular to the direction of gravity.

As a result of the balance among gravity, the electric field, and the surface tension at a position of the lower surface of the liquid metal, the lower surface of the liquid metal is a flat surface along a top end cross section of the hollow cover tube; that is, a flat surface perpendicular to an axis of the cover tube, because the surface tension is dominant in this case. This maintains true until the cover tube is tilted by plus or minus 60 degrees relative to the direction of gravity.

In the hollow cover tube container, a solid high melting point material is used as a bulk material. The bulk material is not a thin film having a thickness of 5 μm or less. The bulk material and at least of a surface of cover tube does not chemically react with a liquid electron emission material, for example, a lanthanum hydride liquid. When the lanthanum liquid is dissolved by a chemical reaction, the lanthanum liquid forms a compound with the cover tube container material and its quality changes, and thus a work function changes and an electron emission capability significantly decreases. In addition, a thickness of the hollow cover tube container gradually reduces, a hole is formed at the end, the lanthanum hydride liquid leaks out to an unexpected surface to form liquid droplets, and electrons are also emitted from the liquid droplets. At this time, an electron gun having an unexpectedly large emission amount is obtained.

However, the electrons emitted from the lanthanum hydride liquid from the unexpected hole form an electron flow that cannot be used for normal applications. The material of the hollow cover tube container should not contain cracks. For this purpose, a material having a high melting point of 2000° C. or higher is required. It is desirable that the electron gun has a high melting point. In order to maintain a certain shape of the electron gun at a high temperature, the electron gun desirably has a high tensile strength, a high bending strength, or the like of 500 Mpascal or more at a high temperature up to 2000° C., and a Mohs hardness of 6 or more.

In order not to chemically react with the lanthanum liquid, carbon, silicon, silicon carbide, silicon nitride, and boron carbide ($B_4C$) cannot be used.

Examples of such a material having a high melting point include tungsten, rhenium, tantalum, molybdenum, titanium diboride, zirconium diboride, and tungsten boride. A mixed sintered material of titanium boronide ($TiB_2$), boron nitride (BN), and aluminum nitride (AlN) may be used. Borides (boronides), nitrides, and oxides (excluding $Al_2O_3$ alumina) of metals or transition metals other than those described above may be used as the cover tube container material. For this reason, these substances can be constituted as main components. Although the bulk material may be a conductor, when the bulk material is an insulating substance, it is necessary to form a conductive film on an outer surface, a bottom surface, the upper surface, and the inner surface of the cover tube. A thickness of the conductive film is 1 μm to 5 μm. Since a film on the inner surface comes into contact with the lanthanum liquid and may break, the lanthanum liquid needs to prevent liquid leakage by a bulk (having a thickness and a certain volume) of the hollow cover tube container.

According to an experimental trial, a single crystal of titanium diboride, Zirconium diboride, hafnium diboride, tantalum diboride, or yttrium diboride exhibited the most excellent performance when used as the cover tube.

By using a back cover 123 of the hollow cover tube container that prevents unnecessary evaporation of the liquid electron emission material, it is possible to achieve an extended lifetime of 25 times or more and an extended lifetime of 5 years or more.

Reference numeral 122 depicts a ceramic disk of an electric insulator for fixing the gripper 117, reference numeral 115 depicts an upper portion of an electron emission amount controlling Wehnelt electrode, and reference numeral 121 shows the direction of gravity.

Figure 2:
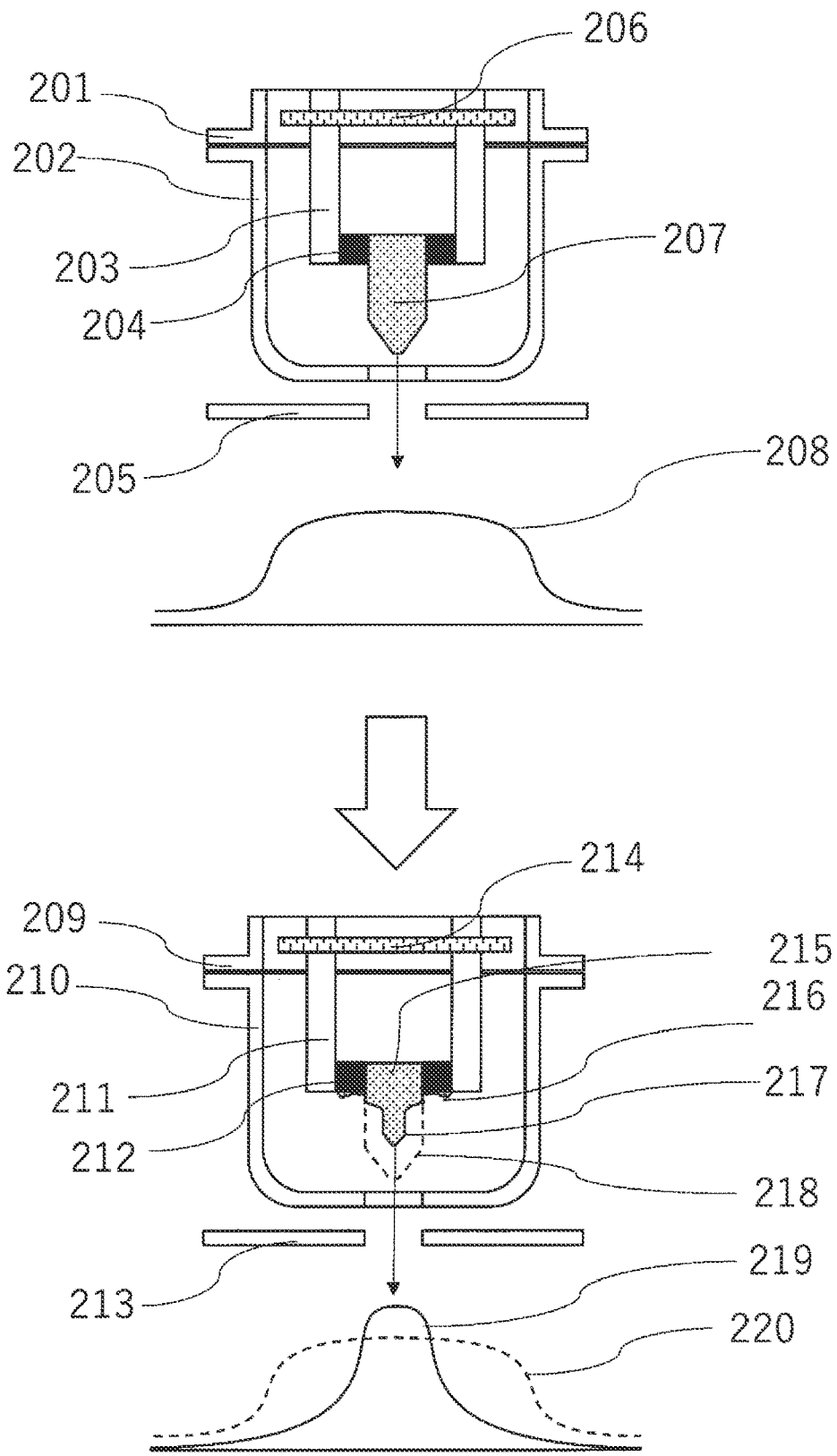
FIG. 2 is a view showing that a solid LaB6 single crystal electron gun according to a comparative example emits electrons at a high temperature, that the LaB6 crystal evaporates, and that a shape of the electron gun changes.

FIG. 2 is a view showing a lifetime of the solid LaB6 crystal according to comparative examples. An LaB6 crystal 207 before use in FIG. 2 has an irradiation distribution 208 of uniform intensity when emitting electrons by being heated and application of an acceleration voltage. However, when the electron gun material is evaporated and consumed, a flat surface area of a top end portion becomes small, and an LaB6 crystal 215 including a thin outer columnar portion is formed. In this case, an irradiation distribution 219 of an electron gun emission has a strong intensity only at a center, and an area of a uniform irradiation distribution is fairly small. Accordingly, when an electron gun emission distribution changes in this way, it has to be said that the electron gun has reached an end of a lifetime. In general, when an electron gun of LaB6 crystal is used at 1550° C. to 1600° C., the lifetime comes to about 500 hours to 1000 hours. When a top end flat portion has a diameter of 50 μmϕ, the top end has a diameter of 10 μmϕ or less after passage of 1000 hours in the lifetime. This is a problem of the lifetime.

There is another problem in addition to the lifetime of the electron gun. As shown in FIG. 2, when the temperature of the LaB6 crystal is high, the LaB6 crystal 207 is consumed and thinned. At the same time, an evaporated substance 216 of the LaB6 material is deposited on a surface of a pyrolytic graphite heater 212, and a resistance value of the heater is lowered. When the same heating current is passed, a temperature of the LaB6 crystal is lowered.

Reference numeral 201 depicts an upper portion of an electron emission amount controlling Wehnelt electrode, reference numeral 202 depicts a lower portion of the electron emission amount controlling Wehnelt electrode, reference numeral 203 depicts a metal gripper through which the heating current flows, reference numeral 204 depicts a PG (pyrolytic graphite) heater, reference numeral 205 depicts an anode, reference numeral 206 depicts a ceramic disk of an electrical insulator for fixing the metal gripper 203, reference numeral 207 depicts the LaB6 single crystal at the start of use, reference numeral 208 shows the electron emission distribution at the start of use, reference numeral 209 depicts an upper portion of an electron emission amount controlling Wehnelt electrode, reference numeral 210 depicts a lower portion of the electron emission amount controlling Wehnelt electrode, reference numeral 211 depicts a metal gripper through which a heating current flows, reference numeral 212 depicts a PG (pyrolytic graphite) heater, reference numeral 213 depicts an anode, reference numeral 214 depicts a ceramic disc of an electrical insulator for fixing 211, reference numeral 215 shows a part of the LaB6 crystal of after use, reference numeral 216 depicts the evaporated substance of the LaB6 crystal, which is a source of temperature reduction by reducing a heater resistance value and is deposited on the PG (pyrolytic graphite) heater, reference numeral 217 shows a shape of the LaB6 single crystal which is sublimated and consumed at a high temperature, reference numeral 218 shows a shape of the LaB6 single crystal which is not consumed at the start of use, reference numeral 219 shows an electron emission distribution after the electron emission distribution at the start of use is changed by depletion of the LaB6 single crystal, and reference numeral 220 shows an electron emission distribution at the start of use.

Figure 3:
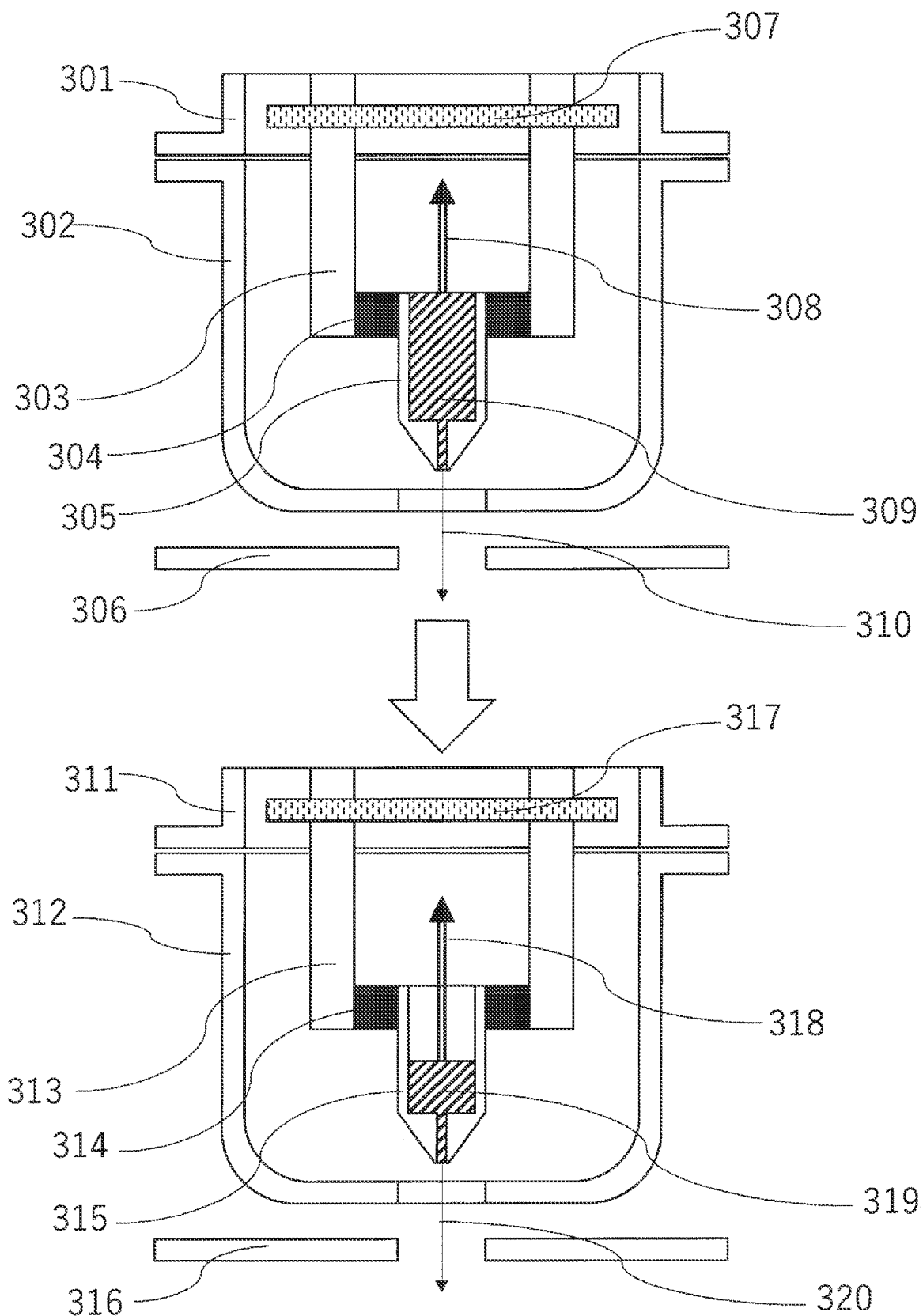
FIG. 3 is a view showing a decrease in a total amount of liquid due to evaporation of a liquid electron gun electron emission material when an electron emission surface according to the embodiment faces the direction of gravity.

FIG. 3 is a view showing a decrease in the total amount of liquid due to evaporation of the liquid electron gun electron emission material according to the present embodiment when the electron emission surface faces the direction of gravity. By reference to this drawing, there will be described a case where a back cover of the cover tube container is removed to show evaporation of lanthanum hydride. In the electron emission surface, a lanthanum hydride surface, which is the liquid electron emission material, emits electrons from a substantially flat surface determined by gravity, the electric field, and the surface tension. Accordingly, even as time passes, a height of the electron emission surface in the direction of gravity and the shape of the liquid surface are kept completely unchanged, and thus a high luminance and a long lifetime are maintained. This is an excellent point of the present embodiment. However, when along period of time passes, liquid electron emission material lanthanum hydride 309 at the start of use evaporates into a vacuum as a vapor of lanthanum at a constant vapor pressure in upper portion direction 308. A liquid surface at the start of use becomes a liquid surface in an upper portion direction 318 of the liquid electron emission material 319 after a certain period is lowered. Finally, a total liquid amount is depleted in about three months. This is a lifetime of the liquid electron gun without back cover. However, as shown in the embodiment in FIG. 1B, by using the back cover 123 of the hollow cover tube container that prevents unnecessary evaporation of the liquid electron emission material, it is possible to achieve an extended lifetime of 25 times or more and an extended lifetime of 5 years or more.

Reference numeral 301 depicts an upper portion of an electron emission amount controlling Wehnelt electrode, reference numeral 302 shows a lower portion of the electron emission amount controlling Wehnelt electrode, reference numeral 303 depicts a metal gripper through which a heating current flows, reference numeral 304 depicts a PG (pyrolytic graphite) heater, reference numeral 305 depicts a hollow cover tube container, reference numeral 306 depicts an anode, reference numeral 307 depicts a ceramic disc of an electrical insulator for fixing the metal gripper 303, reference numeral 308 shows the direction in which the liquid electron emission material evaporates from the back surface of the cover tube container, reference numeral 309 depicts a liquid electron emission material, reference numeral 310 depicts an electron beam emitted in the direction of gravity, reference numeral 311 depicts an upper portion of an electron emission amount controlling Wehnelt electrode, reference numeral 312 depicts a lower portion of the electron emission amount controlling Wehnelt electrode, reference numeral 313 depicts a metal gripper through which the heating current flows, reference numeral 314 depicts a PG (pyrolytic graphite) heater, reference numeral 315 depicts a hollow cover tube container, reference numeral 316 depicts an anode, reference numeral 317 depicts a ceramic disc of an electrical insulator for fixing the metal gripper 313, reference numeral 318 shows the direction in which the liquid electron emission material evaporates from the back surface of the cover tube container, reference numeral 319 depicts the liquid electron emission material which is evaporated as time passes and the total liquid amount reduces, and reference numeral 320 depicts an electron beam emitted in the direction of gravity.

Figure 4:
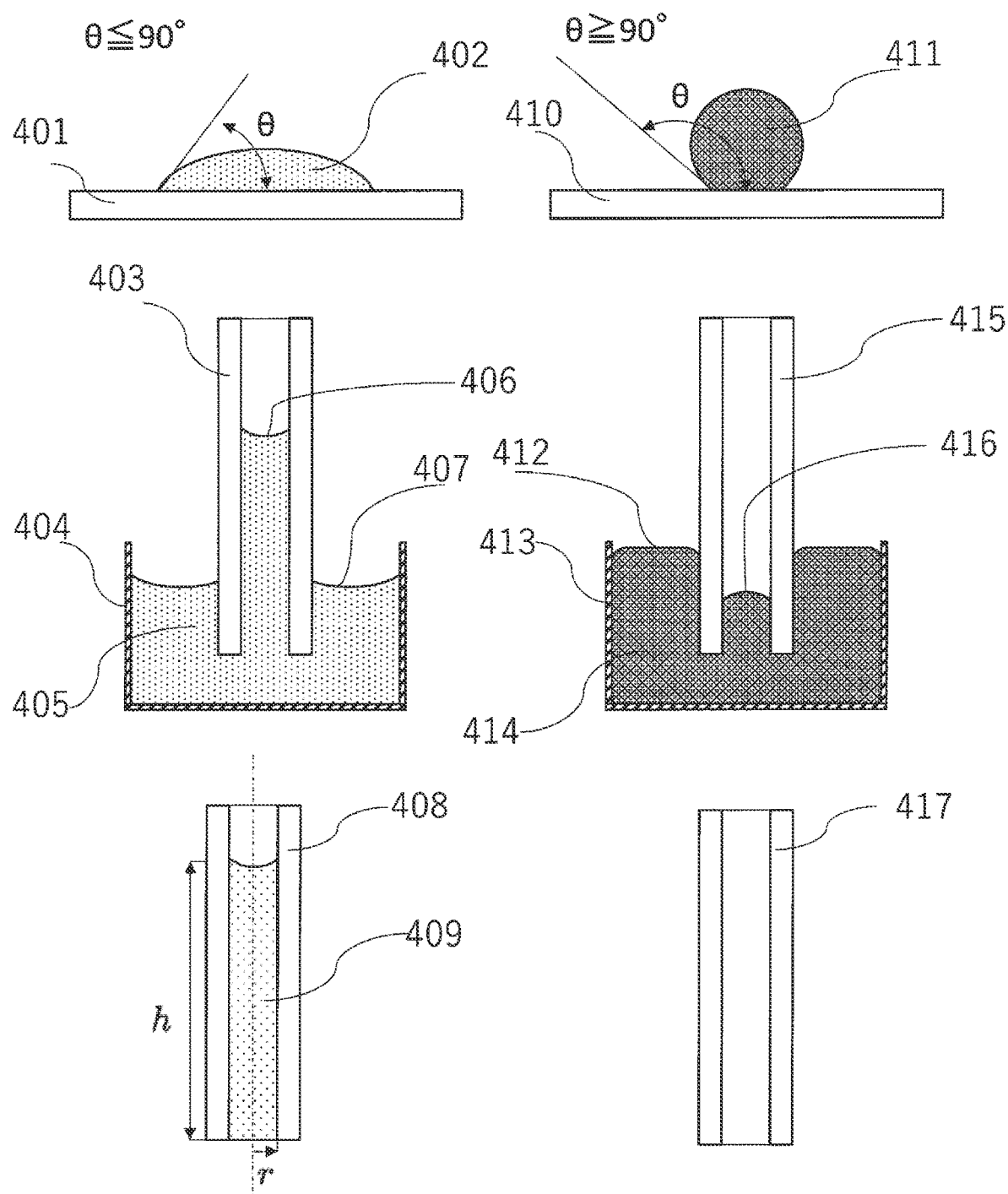
FIG. 4 is a view showing a surface tension and a capillary phenomenon.

FIG. 4 is a view showing the capillary phenomenon and surface tension. When water 402 adheres to a glass substrate 401, the surface tension acts in a direction of an angle θ, and the water 402 adheres to the glass substrate 401 in a form of droplets when θ is 90 degrees or less. A referential sign "θ" is referred to as a contact angle; when the contact angle is 90 degrees or less, wettability is good, and when the contact angle is 90 degrees or more, the wettability is poor and water repellency occurs. In particular, in a case of mercury 411, the contact angle is 90 degrees or more and the wettability is poor. When a glass tube 403 is immersed in water 405 in a water container 404, the water is suctioned onto the glass tube by the capillary phenomenon. A height h of an upper surface 406 of a water surface that rises by the capillary phenomenon inside the glass tube is $h=(2\gamma_{LG}\cos\theta)/r\rho g$, in which the surface tension in the liquid is $\gamma_{LG}$ (unit: dyn/cm: 72 dyn/cm in a case of water), a liquid density is $\rho$ (1 in the case of water, 6 in a case of lanthanum), a gravitational acceleration is g (980 cm/s$^2$), and a radius of the glass tube is r. When a radius of the glass tube is 0.5 mm, the rise of the liquid surface is 28 mm. In the case of mercury having a contact angle of 90 degrees or more, a mercury surface 416 in the glass tube is lower than a mercury surface 412 in a mercury container 413. For this reason, in the case of mercury, when a glass tube 415 is raised, as indicated by a reference numeral 417, mercury does not remain in the tube by the capillary phenomenon in which the wettability of the mercury is poor in the glass tube, which becomes empty when the glass tube is separated from the mercury container and in the glass tube having the contact angle larger than 90 degrees. When the above-described capillary phenomenon is applied to the hollow cover tube container of the liquid electron gun, the liquid electron emission material adheres to an inner wall side surface inside the cover tube container, and even if there is an opening in the lowermost surface, the liquid electron emission material does not leak out from the cover tube container, so that a stable, substantially flat liquid surface balanced by gravity, the electric field, and the surface tension is formed. It is important that electrons can be stably emitted in the perpendicular direction from a substantially flat liquid surface of the liquid.

Reference numeral 407 depicts a water surface other than a glass tube of a water container, reference numeral 408 depicts a glass tube, reference numeral 409 depicts water inside the glass tube when the glass tube is separated from the water container due to the capillary phenomenon (a lowermost surface is a substantially flat surface due to surface tension), reference numeral 410 depicts a glass substrate, reference numeral 412 depicts a mercury liquid surface other than the glass tube, and reference numeral 414 depicts mercury.

Table 1 shows a limit value of a liquid height of the liquid electron gun due to the capillary phenomenon; that is, "limit height of lanthanum liquid". The limit height of the lanthanum liquid is the liquid height allowed corresponding to the diameter of the opening of a cover member, which indicates the liquid height of water, lanthanum, and cerium that can adhere to the inside of the cylindrical capillary tube due to the capillary phenomenon. The surface tension of the water is 72.75 dyn/cm for calculation. The value of lanthanum is obtained from the value of water by divided with density of lanthanum. The value of cerium is obtained from the value of water by divided with density of cerium. It is said that both lanthanum and cerium have a surface tension of 10 times or more at 1,000° C. or higher. So that the actual limit height of lanthanum and cerium is thought be much larger than the value in the Table 1.

TABLE 1

| Limit Height of Lanthanum Liquid | | | | | | | | | | |
| --- | --- | --- | --- | --- | --- | --- | --- | --- | --- | --- |
| Inner Diameter of Opening of Cover Member (mm) | 0.1 | 0.2 | 0.3 | 0.4 | 0.5 | 0.6 | 0.7 | 0.8 | 0.9 | 1.0 |
| Liquid Surface Height of Water mm) | 280.0 | 140.0 | 93.3 | 70.0 | 56.0 | 46.7 | 40.0 | 35.0 | 31.1 | 28.0 |

TABLE 1-continued

| | Limit Height of Lanthanum Liquid | | | | | | | | |
|---|---|---|---|---|---|---|---|---|---|
| Limit Height of Lanthanum Liquid Surface (mm) | 46.7 | 23.3 | 15.6 | 11.7 | 9.3 | 7.8 | 6.7 | 5.8 | 5.2 | 4.7 |
| Limit Height of Cerium Liquid (mm) | 43.1 | 21.5 | 14.4 | 10.8 | 8.6 | 7.2 | 6.2 | 5.4 | 4.8 | 4.3 |

The liquid height allowed corresponding to the diameter of the opening of the cover member, which indicates the liquid height of lanthanum and cerium that can adhere to the inside of the cylindrical capillary tube due to the capillary phenomenon, is calculated with the surface tension of water of 72.75 dyn/cm. The value of lanthanum is obtained from the value of water by divided with density of lanthanum. The value of cerium is obtained from the value of water by divided with density of cerium. It is said that both lanthanum and cerium have a surface tension of 10 times or more at 1,000° C. or higher. Since the tension corresponds to about 1000 dyn/cm. it may be 10 times or more the values in Table 1. The values in Table 1 are calculated with the surface tension of water at normal temperature being 72 dyn/cm. When the inner diameter of the cover tube is 0.5 mm, the liquid surface height of water is 56 mm, and when a lanthanum density is 6, a height of 9.3 mm is allowed. This condition is always satisfied, because it is longer than 3 mm, which is an actual length of the electron gun cover tube container. It is known that an average inner diameter of a thickest portion of the cover tube container and the limit height are inversely proportional to each other. Therefore, unless the cover tube container is made thicker, the lanthanum liquid does not drip from a cover tube opening in the direction of gravity by itself. Since a density of cerium is 6.5, the condition hardly changes. According to experiments conducted by the present inventors, the surface tension of a high melting point metal and a metal boride to the lanthanum is sufficiently strong, and in particular, it has not been experimentally found that the wettability is a problem at 1000° C. or higher. If an actual required operation temperature of 1000° C. to 1600° C. and the luminance and a required value of the lifetime can be determined, the inner diameter of the hollow cover tube container can be determined.

Figure 5A:
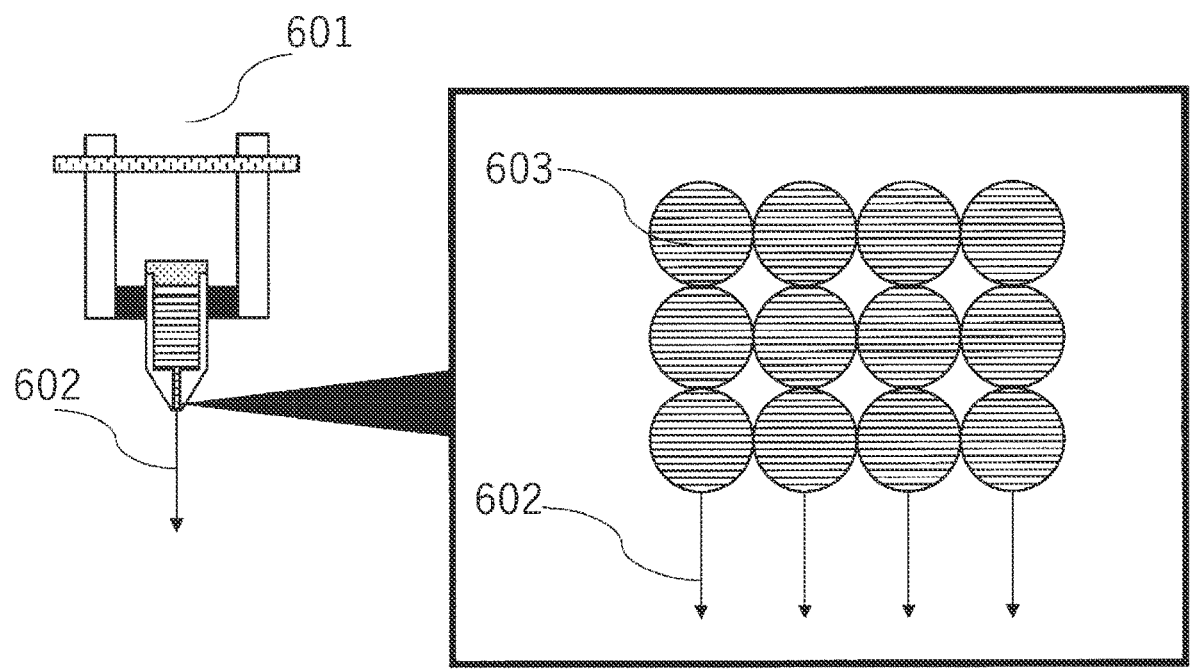
FIG. 5A is a view showing an electron emission material of a liquid electron gun and shows a case where, for example, a lanthanum liquid is used.
Figure 5B:
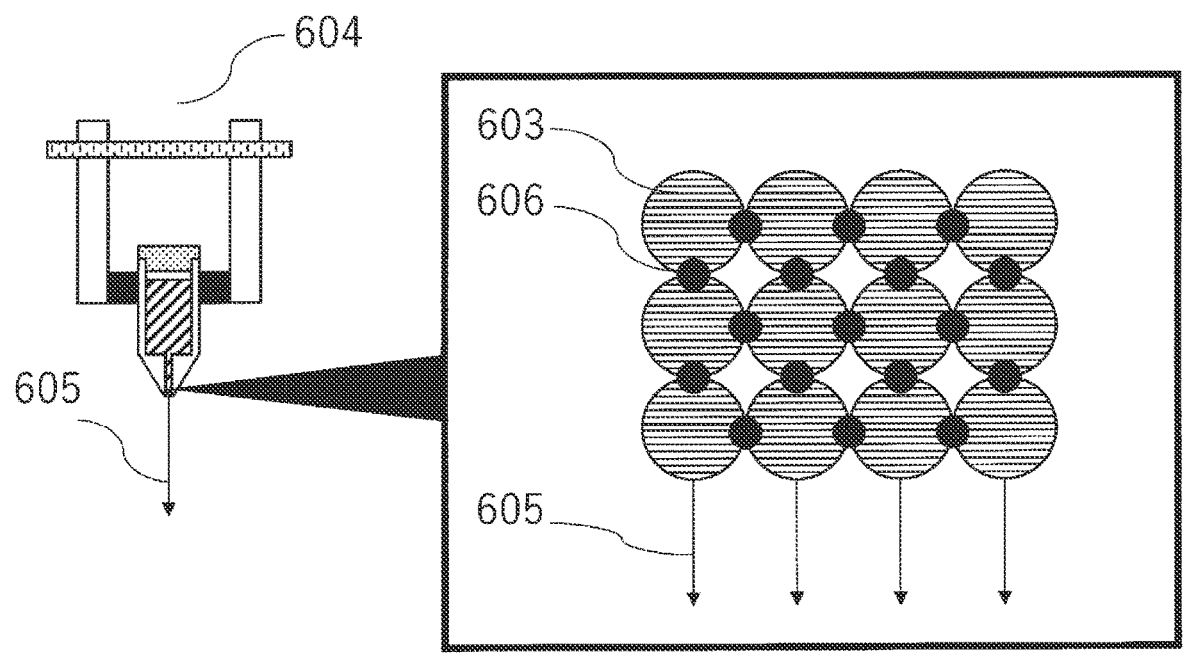
FIG. 5B is a view showing an electron emission material of a liquid electron gun and shows a case where, for example, a hydrogenated lanthanum liquid is used.

FIGS. 5A and 5B are views showing an electron emission material of a liquid electron gun. In FIG. 5B, an electron beam 605 is emitted from lanthanum hydride from an opening of a top end portion of a cover tube container. FIG. 5A is a view showing a case where the lanthanum liquid is used. In this case, hydrogen gas needs to be supplied to an electron gun chamber to be hydrogenated and the work function needs to be reduced. In particular, in a case where hydrogenation is not performed, oxidation is performed in the air for about 10 minutes, and the reaction with moisture starts to cause hydroxylation. Since it is difficult to use the above material as the electron gun again, as shown in FIG. 5B, it is necessary to react lanthanum atoms 603 with hydrogen atoms 606 to obtain lanthanum hydride. That is, hydrogenation is necessary not only to maintain electron emission efficiency, but also to prevent oxidation when the material is taken out into the atmosphere. If the hydrogenation is performed at a certain level or more, lanthanum hydride LaHx are formed on the electron emission surface, and therefore oxidation can be prevented. If the hydrogenation is sufficient, it is not always necessary to flow hydrogen gas into a vacuum of the electron gun chamber at all times when the lanthanum hydride electron gun is operated.

Reference numeral 601 depicts an overall view of the liquid electron gun, reference numeral 602 depicts an electron beam emitted in the direction of gravity, reference numeral 603 depicts the lanthanum atoms which are an electron emission material, reference numeral 604 depicts an overall view of the liquid electron gun, reference numeral 605 depicts an electron beam emitted in the direction of gravity, and reference numeral 606 depicts the hydrogen atoms that have entered liquid atomic lanthanum.

Figure 6:
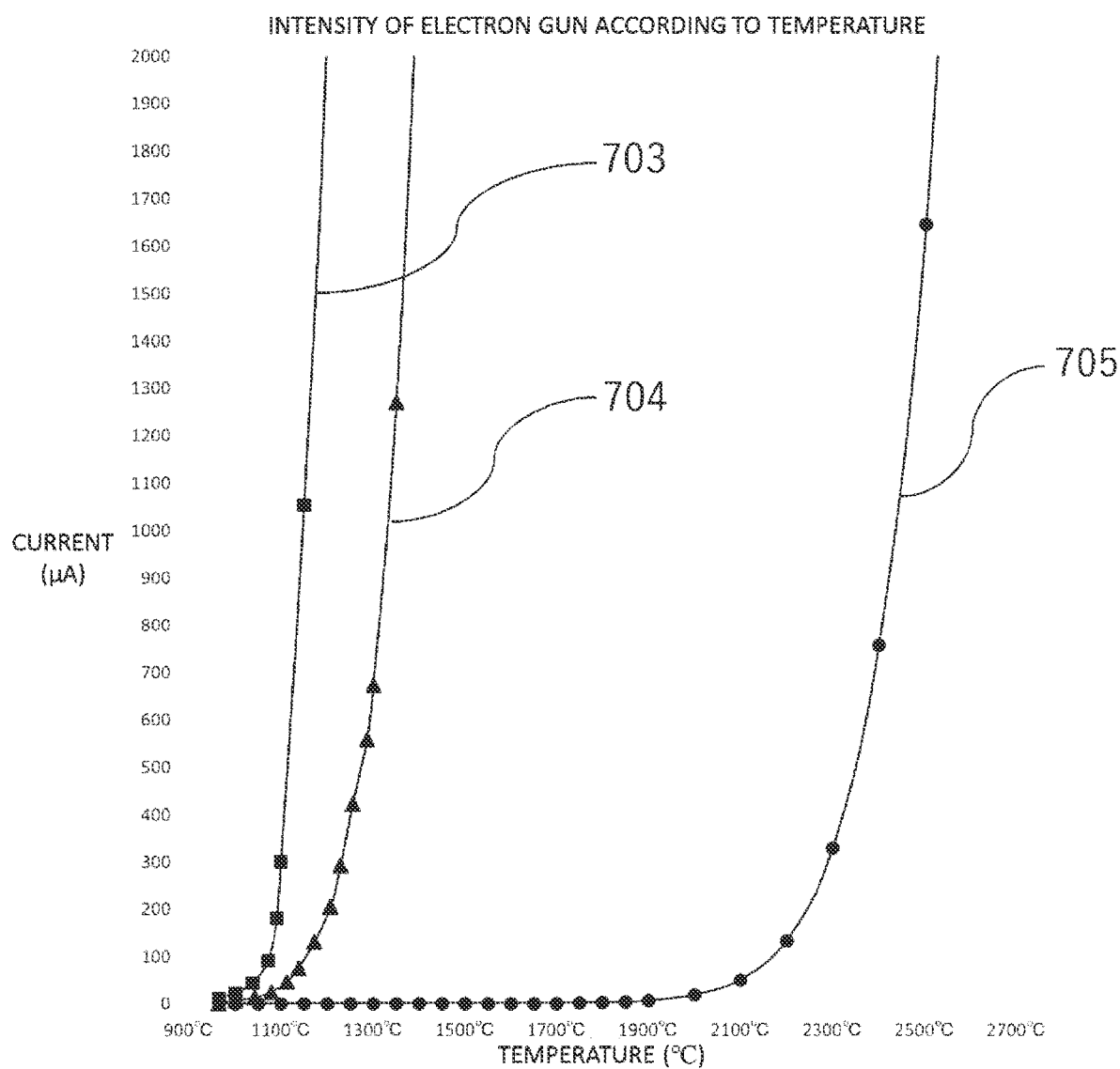
FIG. 6 is a diagram showing a relationship between a heating temperature of an electron gun and a generated current value.

FIG. 6 is a diagram showing a relationship between heating temperature of an electron gun and emission current values. A horizontal axis represents temperature (° C.) of the electron gun, and a vertical axis represents intensity (current (pA)) of emission currents. Reference numeral 703 shows an emission current of lanthanum hydride. Reference numeral 704 shows an electron emission current of the solid LaB6 single crystal. This shows that, at the same temperature, an emission current intensity of lanthanum hydride is 100 to 1000 times higher than an emission current intensity of the LaB6 single crystal. That is, lanthanum hydride can obtain the same strength at a temperature that is 300° C. lower than the operation temperature of the LaB6 single crystal. Further, since the LaB6 single crystal is solid, the surface of the LaB6 single crystal is changed in shape due to evaporation, and thereby a use condition cannot be satisfied in a short time. Lanthanum hydride is liquid, and a liquid surface thereof is stably determined by gravity, the electric field, and the surface tension, and the liquid amount can be used until exhaustion. Accordingly, an actual lifetime is extended by a factor of 10 times to 100 times. Reference numeral 705 depicts an electron emission intensity of a tungsten electron gun. Tungsten is used at a temperature exceeding 2000° C., and a filament having a diameter ϕ of 100 μm evaporates and breaks in about 100 hours, and thereby has a short lifetime.

Table 2 shows types of elements that are candidates for a liquid electron emission material, and relates to suitability of various elements and substances as the liquid electron emission material. There are shown a usage appropriateness, a material name, a melting point, a boiling point, and whether the material is liquefied at 1000° C. to 1500° C. and a vapor pressure indicating an evaporation degree in a temperature range thereof.

TABLE 2

| Usage Appropriateness Adaptability | Material Name | Melting Point (° C.) | Boiling Point (° C.) | Special Matter: Whether liquefied at 1000° C. to 1500° C., and what is the vapor pressure? | Work Function | |
|---|---|---|---|---|---|---|
| No | Ba (barium) | 726 | 1,637 | Since the vapor pressure is 1,000 pascal at 1,115° C., evaporation is likely to occur. | | |
| No | BaO (barium oxide) | 1,923 | 2,000 | When the melting point is 1,000° C. to 1,500° C., not liquefied. | | |
| No | Sr (strontium) | 777 | 1,382 | Since the vapor pressure is 100,000 pascal at 1,115° C., evaporation is likely to occur. | | |
| No | Sr(OH)$_2$ (strontium hydroxide) | 101 | 710 | Since the boiling, point is 700° C., evaporation occurs at 1,000° C. to 1,500° C. | | |
| No | SrO (strontium oxide) | 2,430 | 3,0001 | Since the melting point is 2,430° C., not liquefied at 1,000° C. to 1,500° C. | | |
| No | Ca (calcium) | 842 | 1,484 | Since the vapor pressure is 100,000 pascal at 1,170° C., evaporation is likely to occur. | | |
| No | Mg (magnesium) | 650 | 1,091 | Since the vapor pressure is 100,000 pascal at 1,088° C., evaporation is likely to occur. | | |
| No | MgO (magnesium oxide) | 2,852 | 3,600 | Since the melting point is 2,852° C., not liquefied at 1,000° C. to 1,500° C. | | |
| No | Cs (cesium) | 28 | 671 | Since the vapor pressure is 100,000 pascal at 667° C., evaporation is likely to occur. | | |
| No | Rb (rubidium) | 39 | 688 | Since the vapor pressure is 100,000 pascal at 685° C., evaporation is likely to occur. | | |
| Yes | Gd (gadolinium) | 1,312 | 3,270 | The vapor pressure is 0.1 pascal at 1,363° C., The melting point is 1,312° C. | CPD[*1] | 2.9 |
| Yes | Ce (cerium) | 795 | 3,443 | The vapor pressure is 0.001 pascal at 1,300° C. The melting point is 795° C. | PE[*2] | 2.9 |
| Yes | La (lanthanum) | 970 | 3,464 | The vapor pressure is 0.001 pascal at 1,300° C. The melting point is 920° C. | PE[*2] | 3.5 |
| No | Nd (neodymium) | 1,024 | 3,074 | The vapor pressure is 1 pascal at 1,322° C. The melting point is 1,024° C. | PE[*2] | 3.2 |
| No | Th (thorium) | 1,842 | 4,788 | Since the melting point is 1,842° C., not liquefied at 1,000? C. to 1,500° C. | | |
| Yes | Pr (prasecodymium) | 935 | 3,520 | The vapor pressure is 1 pascal at 1,498° C. The melting point is 935° C. | | |
| No | Pm (promethium) | 1,042 | 3,000 | No stable isotope exists, Vapor pressure unknown. | | |
| No | Sm (samarium) | 1,072 | 1,794 | Since the vapor pressure is 100 pascal at 967° C., evaporation is likely to occur. | | |
| No | Eu (europium) | 826 | 1,529 | Since the vapor pressure is 100 pascal at 961° C., evaporation is likely to occur. | PE[*2] | 2.5 |
| Yes | Tb (terbium) | 1,356 | 3,230 | The vapor pressure is 1 pascal at 1,516° C. The melting point is 1,356° C. | PE[*2] | 3 |
| No | Dy (dysprosium) | 1,407 | 2,562 | The vapor pressure is 10 pascal at 1,250° C. The melting point is 1,407° C. | | |
| No | Ho (holmium) | 1,461 | 2,720 | The vapor pressure is 1 pascal at 1,159° C. The melting point is 1,461° C. | | |
| No | Er (erbium) | 1,529 | 2,868 | Since the melting point is 1,529° C., not liquefied at 1,000° C. to 1,500° C. | | |
| No | Tm (thulium) | 1,545 | 1,950 | Since the melting point is 1,545° C., not liquefied at 1,000° C. to 1,500° C. | | |
| No | Yb (ytterbium) | 824 | 1,196 | Since the vapor pressure is 1,000 pascal at 774K, evaporation is likely to occur. | | |
| No | Lu (lutetium) | 2,334 | 4,150 | Since the melting point is 2,334° C., not liquefied at 1,000° C. to 1,500° C. | | |
| No | Zr (zirconium) | 1,855 | 4,409 | Since the melting point is 1,855° C., not liquefied at 1,000° C. to 1,500° C. | | |
| No | Y (yttrium) | 1,526 | 3,336 | Since the melting point is 1,526° C., not liquefied at 1,000° C. to 1,500° C. | | |
| No | Sc (scandium) | 1,541 | 2,836 | Since the melting point is 1,541° C., not liquefied at 1,000° C. to 1,500° C. | | |

*1 CPD = Contact positional difference method,
*2 PE = Photoelectric effect method.

Although frequently used in the related art, the LaB6 single crystal was used at 1500° C. to 1600° C. To find a material superior to this, it was necessary to search for a metal atom capable of being liquefied and having a long lifetime between 1000° C. and 1600° C. That is, it was necessary to search for an element having a low vapor pressure of $10^{-3}$ pascal to $10^1$ pascal in the vicinity of 1200° C. to 1400° C. That is, a material having a melting point of about 1300° C. and a boiling point of more than 3000° C. was required. That is, a material having a large difference between the melting point and the boiling point was required. It was necessary to search for an element whose work function with the element is 3 eV or less and decreases by about 1 eV when the element is hydrogenated to be relatively small. For example, although barium or calcium has a low melting point of 700° C. to 800° C., barium or calcium has a boiling point of about 1500° C. and evaporates immediately during operation, and therefore such an element is inappropriate. According to the discussion by the present inventors, lanthanum and the cerium had vapor pressures of $10^{-3}$ pascal at 1300° C. and were most appropriate elements. In addition, gadolinium has a vapor pressure of $10^{-1}$ pascal at 1300° C., praseodymium 1 pascal at 1500° C., and terbium 1 pascal at 1516° C. Although it is predicted that the latter three have a lifetime significantly shorter than that of lanthanum and cerium, the latter three may be not unusable. From such a discussion, lanthanum and cerium can be proposed as optimal elements.

Figure 7A:
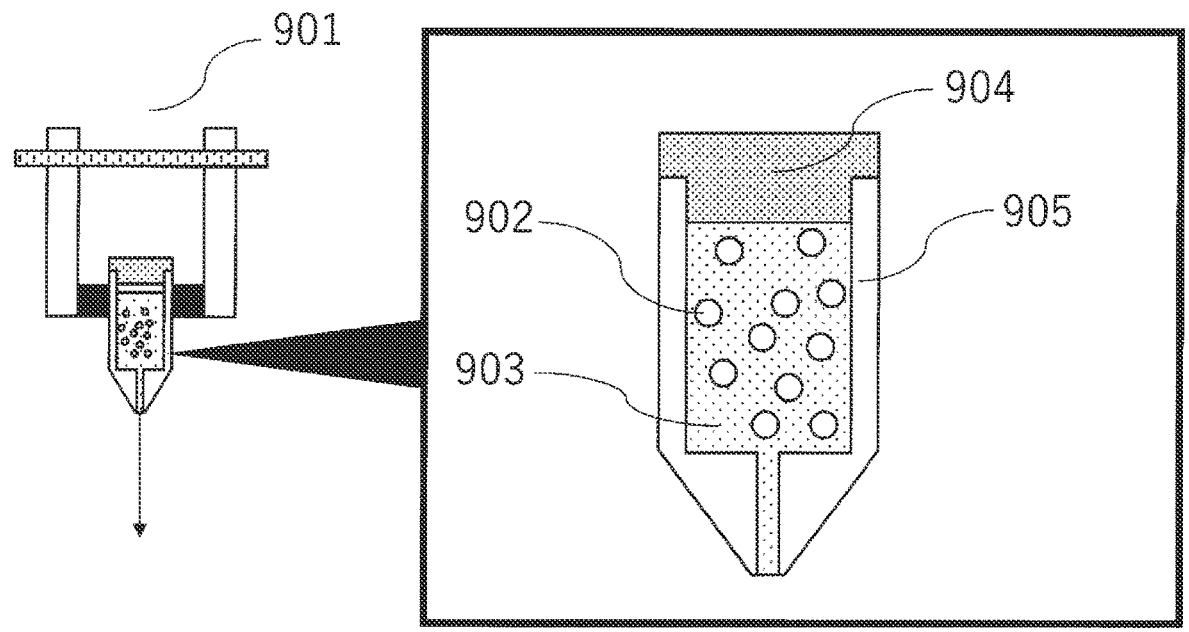
FIG. 7A is a view showing installation of a photocatalyst necessary for cleaning carbon atoms contained inside a liquid electron emission material and is a schematic view when a powder of the photocatalyst is mixed in a liquid material.
Figure 7B:
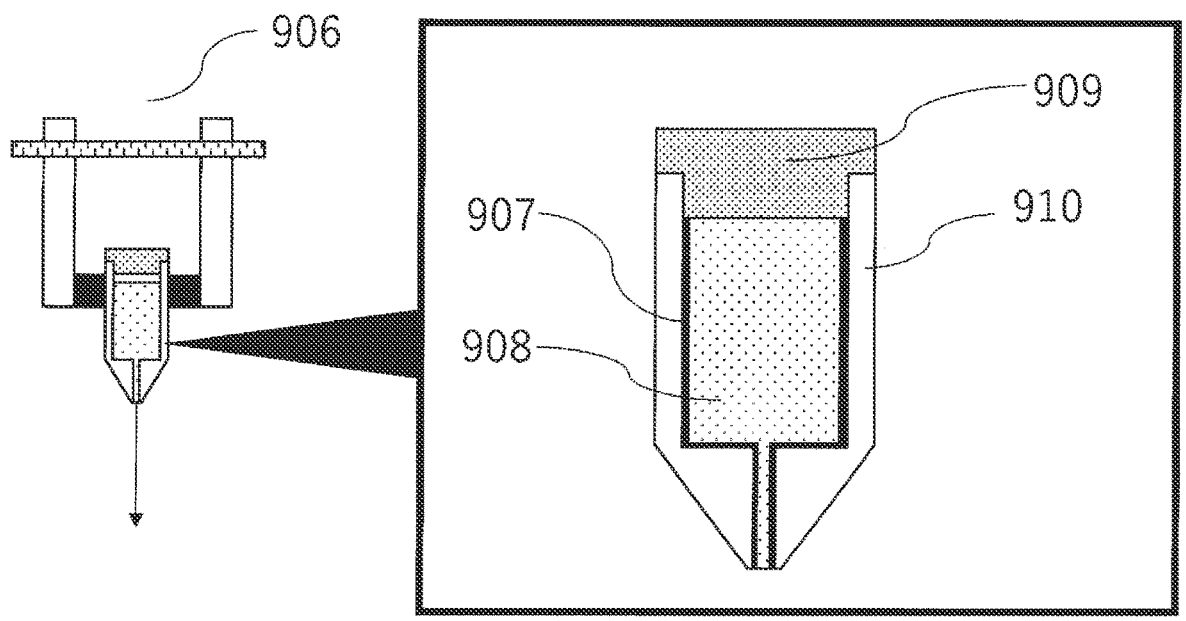
FIG. 7B is a view showing installation of a photocatalyst necessary for cleaning carbon atoms contained inside a liquid electron emission material and is a schematic view when a coating of the photocatalyst is attached to an inner surface of a cover tube.

FIGS. 7A and 7B are views showing installation of a photocatalyst necessary for cleaning carbon atoms contained in a liquid electron emission material. Reference numerals 901 and 906 show overall views of a liquid electron gun. It is known that the carbon atoms significantly deteriorate the electron emission efficiency of lanthanum hydride. Therefore, the carbon atoms contained in the material of a hollow cover tube container may form a compound with the electron emission material, for example, lanthanum atoms of lanthanum or lanthanum hydride. To prevent this, an object is to remove a carbon component in the lanthanum liquid by changing the carbon component into carbon monoxide using titanium dioxide, which is a well-known photocatalyst under application of ultraviolet light, and tungsten trioxide, which is a photocatalyst under application of visible light, for activating residual oxygen in the lanthanum liquid or residual oxygen in the electron gun chamber.

A powder 902 of titanium dioxide ($TiO_2$) and tungsten trioxide ($WO_3$) is mixed in lanthanum hydride liquid 903.

Alternatively, in 7B, an oxide film 907 of titanium dioxide or tungsten trioxide is coated as a photocatalyst to an inner surface of the hollow cover tube container. Since the electron gun emits light of at least visible light or ultraviolet light at 1000° C. or more by a PG (pyrolytic graphite) heater, it is possible to remove carbon impurities by oxidation using light energy emitted by the electron gun. Reference numerals 904 and 909 depict back covers of the cover tube container that prevent lanthanum hydride from evaporating from a back surface of an electron gun emission surface. Reference numerals 905 and 910 depict the hollow cover tube container. Reference numerals 903 and 908 depict lanthanum hydride. According to the description of the drawing, even when a fairly small quantity of carbon components of 0.1% or less is present in the hollow cover tube container, an emission current of the liquid electron gun can be kept constant. However, although the photocatalyst may be unnecessary if the carbon impurities in the cover tube container can be reduced, it is desirable to use the photocatalyst for safety, since carbon contamination in the electron gun chamber is considered. Since a natural oxide film of metal titanium may be used for titanium dioxide and a natural oxide film of metal tungsten may be used for tungsten trioxide, the powder 902 or the oxide film 907 to be used may be metal titanium or metal tungsten.

Figure 8:
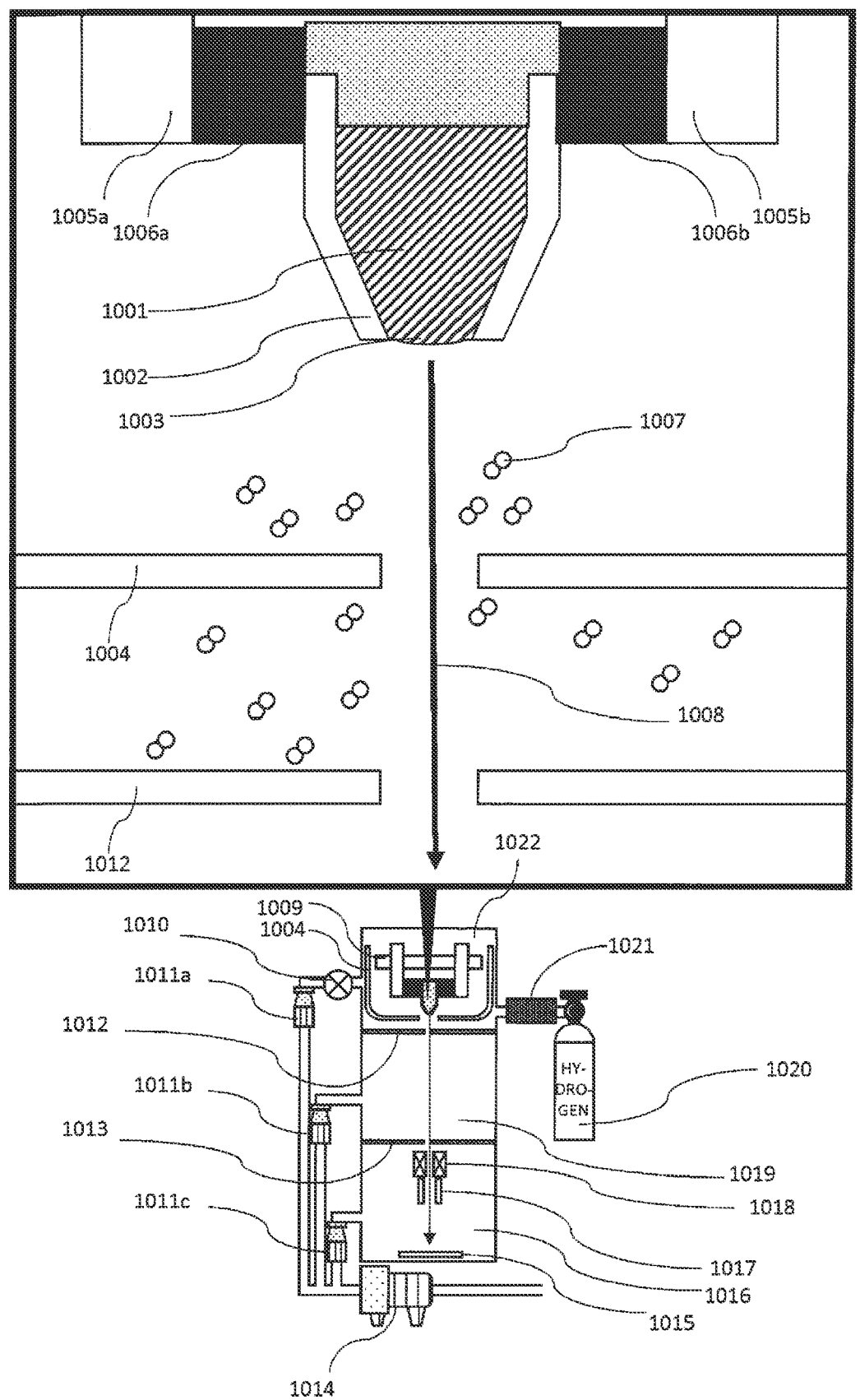
FIG. 8 is a view showing a mode in which hydrogen gas flows into a vacuum electron gun chamber in which a liquid electron gun is installed.

FIG. 8 is a view showing a mode in which hydrogen gas is flown into a vacuum electron gun chamber in which a liquid electron gun is installed. When an amount of hydrogen in lanthanum hydride 1001 that is the liquid electron emission material is insufficient, it is necessary to control a partial pressure of the gas by flowing hydrogen gas molecules 1007 into the electron gun chamber, and to supply an appropriate amount of hydrogen. The hydrogen gas flows from a hydrogen gas cylinder 1020 into an electron gun chamber 1022 through a hydrogen gas adjustment mass flow controller 1021. Normally, a turbo molecular pump 1011a evacuates the inside of the electron gun chamber 1022 when a valve 1010 is opened. However, if the hydrogen gas has a vapor pressure of $1 \times 10^{-4}$ pascal in the electron gun chamber, although almost no load is applied to the turbo molecular pump 1011a. For example, when lanthanum is desired to be hydrogenated in a short time, a hydrogen gas may be desired to flow into the electron gun chamber at a partial pressure of $10^{-3}$ pascal or more. In this case, since the load is applied to the turbo molecular pump 1011a to generate intensive heat, the valve 1010 is closed and a second-stage column 1019 is evacuated by a turbo molecular pump 1011b. In this way, the hydrogen partial pressure in the electron gun chamber is maintained high and fewer loads are applied to the turbo molecular pump. This is because a difference in the hydrogen gas partial pressure can be generated between the electron gun chamber and a second stage column due to a small circular hole of a vacuum partition wall 1012 between the electron gun chamber and a second stage column. Incidentally, an electron beam 1008 passes through a vacuum partition wall 1013 and is radiated on a working substrate 1015 on which the electron beam is radiated, in a third stage column 1016 in which an electron beam irradiation operation is performed by using an electron beam deflection electrode 1017 and an electron beam converging magnetic field lens 1018 and using the above elemental technologies a required work is performed. Electron beam observation, electron beam drawing, or electron beam welding is performed on the working substrate 1015. In this case, the hydrogen gas partial pressure is highest in the electron gun chamber, and then reduces in an order of the second stage column and the third stage column.

Reference numeral 1002 depicts the hollow cover tube container, reference numeral 1003 depicts a liquid surface (a substantial flat surface or a part of a spherical surface having a large radius is formed by surface tension) of an opening at a top end of the cover tube container in which the material of the liquid electron gun is released, reference numeral 1004 depicts an electron emission amount controlling Wehnelt electrode, reference numerals 1005a and 1005b depict metal grippers through which a heating current flows, reference numerals 1006a and 1006b depict PG (pyrolytic graphite) heaters, reference numeral 1009 depicts a ceramic disk of an electric insulator for fixing the grippers 1005a and 1005b, reference numerals 1011a, 1011b, and 1011c depict turbo molecular pumps, and reference numeral 1014 depicts a roughing dry pump.

Figure 9:
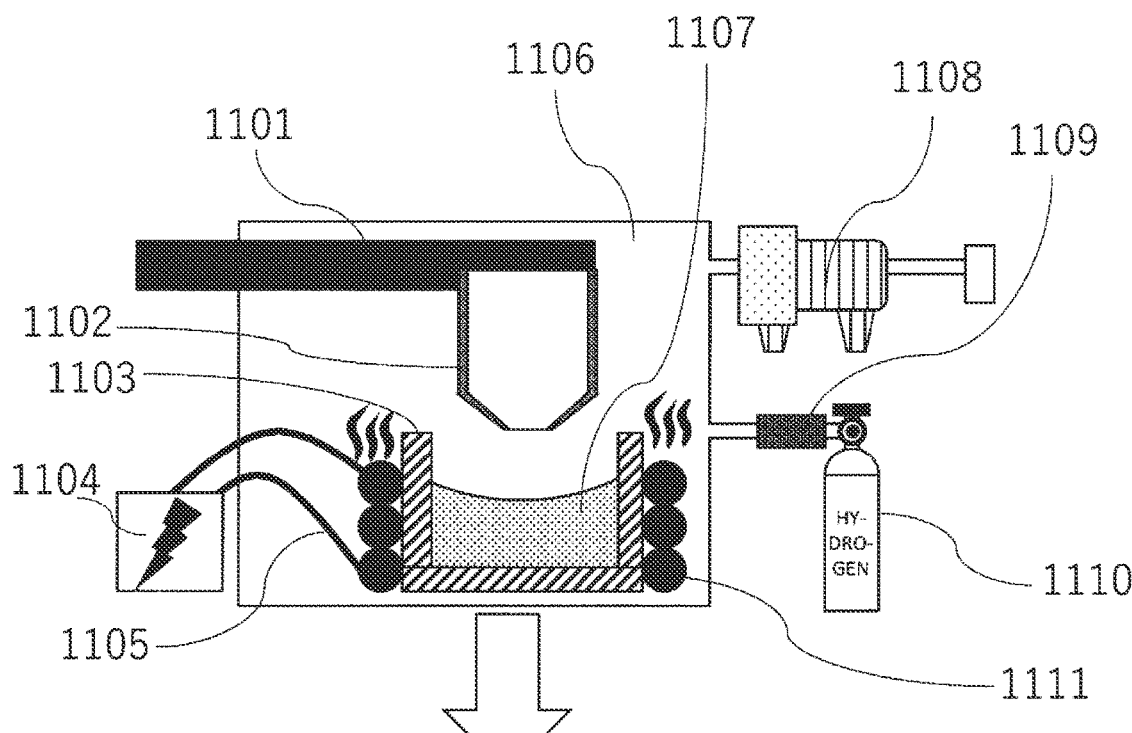
FIG. 9 is a view showing a first method for filling an inside of a hollow cover tube container with a liquid electron emission material.
Figure 9:
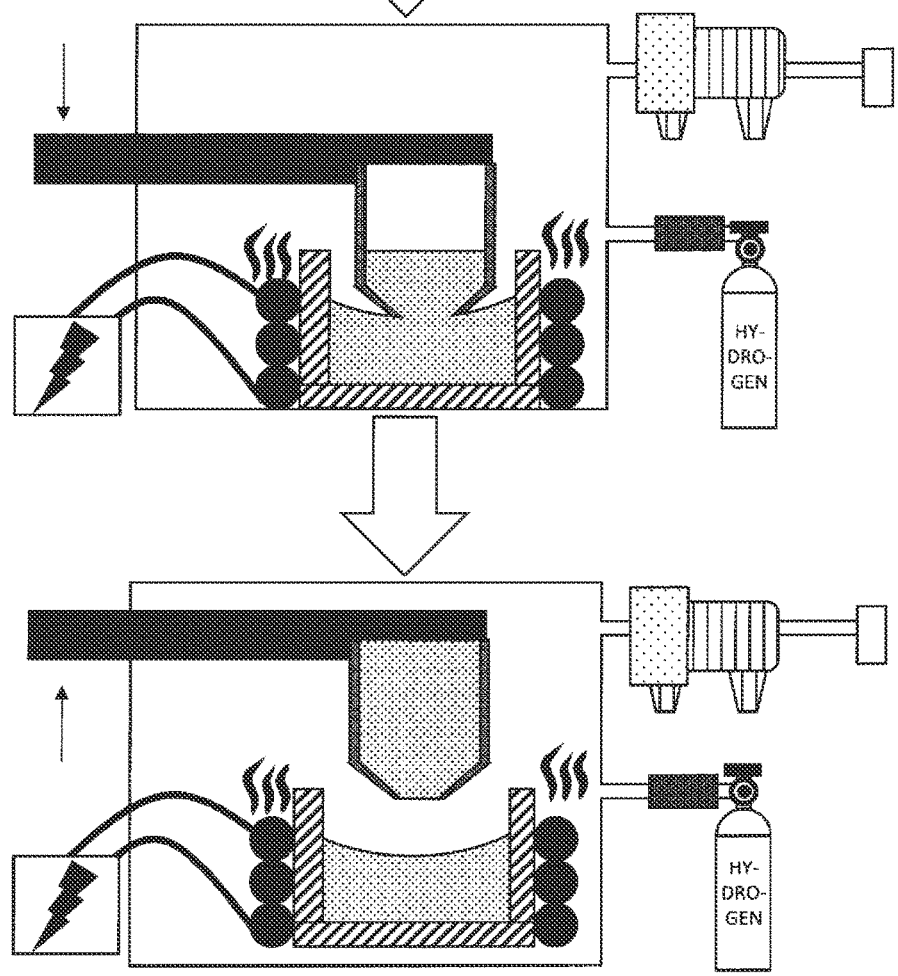

FIG. 9 is a view showing a first method for filling an inside of a hollow cover tube container with the liquid electron emission material. A hollow cover tube container 1102 is suspended by a mechanical device 1101 for holding the hollow cover tube container and moving the hollow cover tube container in a horizontal direction and a vertical direction. Meanwhile, lanthanum liquid 1107, which is a liquid metal, is heated at a high temperature and liquefied by a liquid metal melting heater 1111 in a crucible or a boat 1103 for introducing a liquid metal. The hollow cover tube container 1102 is mechanically lowered until the hollow cover tube container 1102 comes into contact with the lanthanum liquid 1107, and the lanthanum liquid 1107 is suctioned up inside the hollow cover tube container 1102 by the capillary phenomenon. The inside of the cover tube container 1102 is vacuum, and the entire cover tube container is filled with the lanthanum liquid 1107. The cover tube container 1102 is pulled up, and the filling of the lanthanum liquid inside the cover tube container 1102 is completed. During this operation, an inside of a vacuum device 1106 is evacuated by a vacuum pump 1108, and hydrogen gas is introduced from a hydrogen gas cylinder 1110 into the vacuum chamber 1106 by a hydrogen gas flow rate adjustment mass flow controller 1109. As a result, the lanthanum liquid inside the vacuum chamber is hydrogenated. The lanthanum liquid in the hollow cover tube container is also hydrogenated. As a result, a filling of lanthanum hydride is completed.

Reference numeral 1104 depicts a heater power supply for dissolving the liquid metal, reference numeral 1105 depicts a transmission line from the heater power supply to a heater for dissolving the liquid metal, reference numeral 1108 depicts the vacuum pump, reference numeral 1109 depicts the hydrogen gas flow rate adjustment mass flow controller, and reference numeral 1110 depicts the hydrogen gas cylinder.

Figure 10:
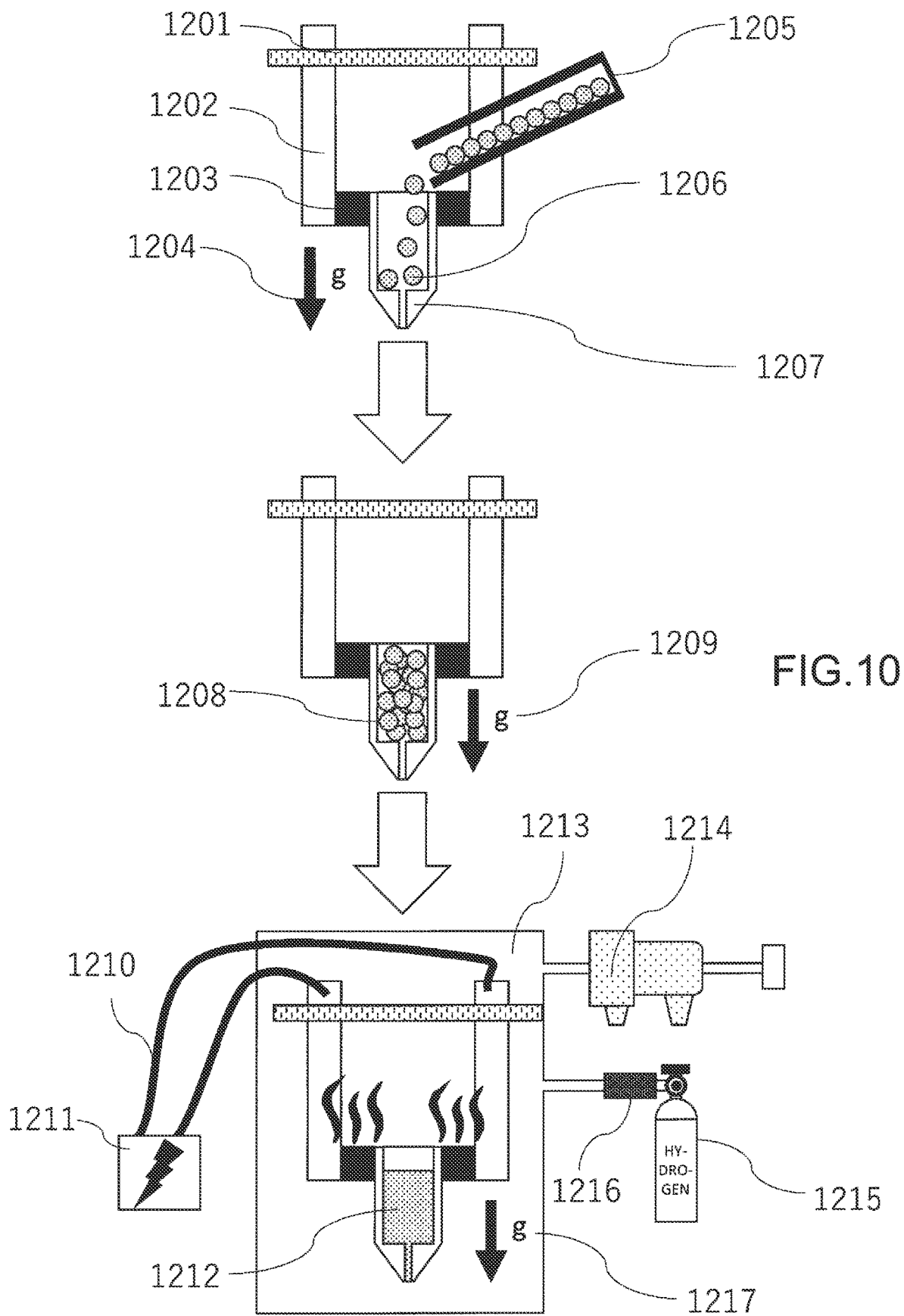
FIG. 10 is a view showing a second method for filling an inside of a hollow cover tube container with a liquid electron emission material.

FIG. 10 is a view showing a second method for filling an inside of a hollow cover tube container with the liquid electron emission material. A hollow cover tube container 1207 faces a downward direction 1204 with respect to gravity. Lanthanum hydride powder is stored in a container 1205 for storing the lanthanum hydride powder from a back surface of the cover tube container, and the lanthanum hydride powder is tilted to fill the container 1205 from the back surface side of the hollow cover tube container 1207. Filled lanthanum hydride powder 1208 is increased in temperature by being heated by a heater 1203 in a vacuum chamber 1213 to become liquid hydrogenated lanthanum 1212. The vacuum chamber 1213 is evacuated by a vacuum pump 1214, and hydrogen gas is supplied from a hydrogen gas cylinder 1215 via a flow rate control mass flow controller 1216 at an appropriate time or continuously as necessary.

As a result, the inside of the hollow cover tube container is filled with lanthanum hydride.

Reference numeral 1201 depicts a ceramic disk of an electric insulator for fixing a gripper, reference numeral 1202 depicts a metal gripper through which a heating current flows, reference numeral 1206 depicts lanthanum hydride powder stored in the hollow cover tube container, reference numeral 1209 shows the direction of gravity, reference numeral 1210 depicts a transmission line from a heater power supply to a heater for dissolving the liquid metal, reference numeral 1211 depicts the heater power supply for dissolving the liquid metal, and reference numeral 1217 shows the direction of gravity.

Figure 11:
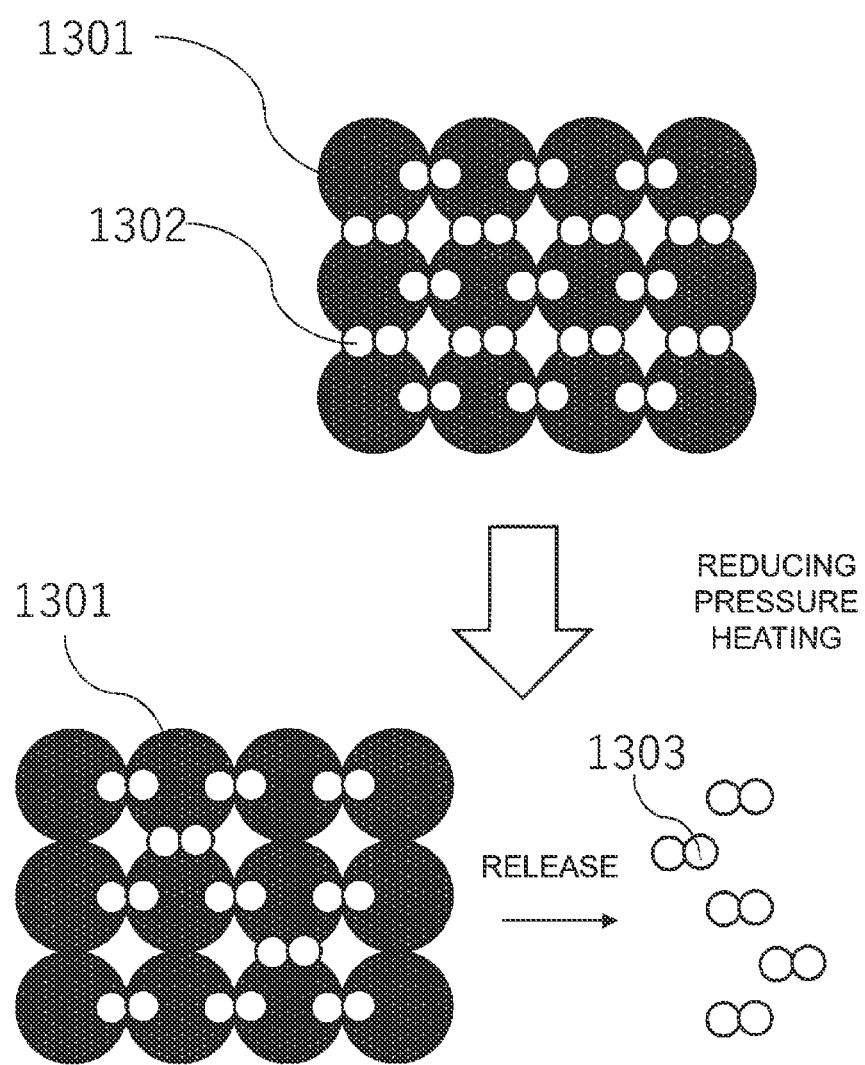
FIG. 11 is a view showing a state in which hydrogen is supplied from a hydrogen storage alloy mixed inside a liquid electron emission material in a form of powder.

FIG. 11 is a view showing a state in which hydrogen is supplied from a hydrogen storage alloy storing a large amount of hydrogen. The hydrogen storage alloy is mixed inside a liquid electron emission material in a form of powder. A cover tube container contains the hydrogen storage alloy together with the liquid metal material. A hydrogen storage alloy 1301 mixed in the lanthanum hydride liquid stores a large amount of hydrogen molecules 1302. When pressure is reduced in the vacuum chamber and the vacuum chamber is heated, the hydrogen storage alloy releases the hydrogen molecules 1303, and hydrogen atoms increase in the lanthanum hydride liquid. In this manner, a quantity of the hydrogen atoms in the lanthanum hydride liquid can be controlled. The hydrogen storage alloy 1301 is a hydrogen storage alloy containing palladium, titanium, zirconium, vanadium. or nickel as main components.

Figure 12A:
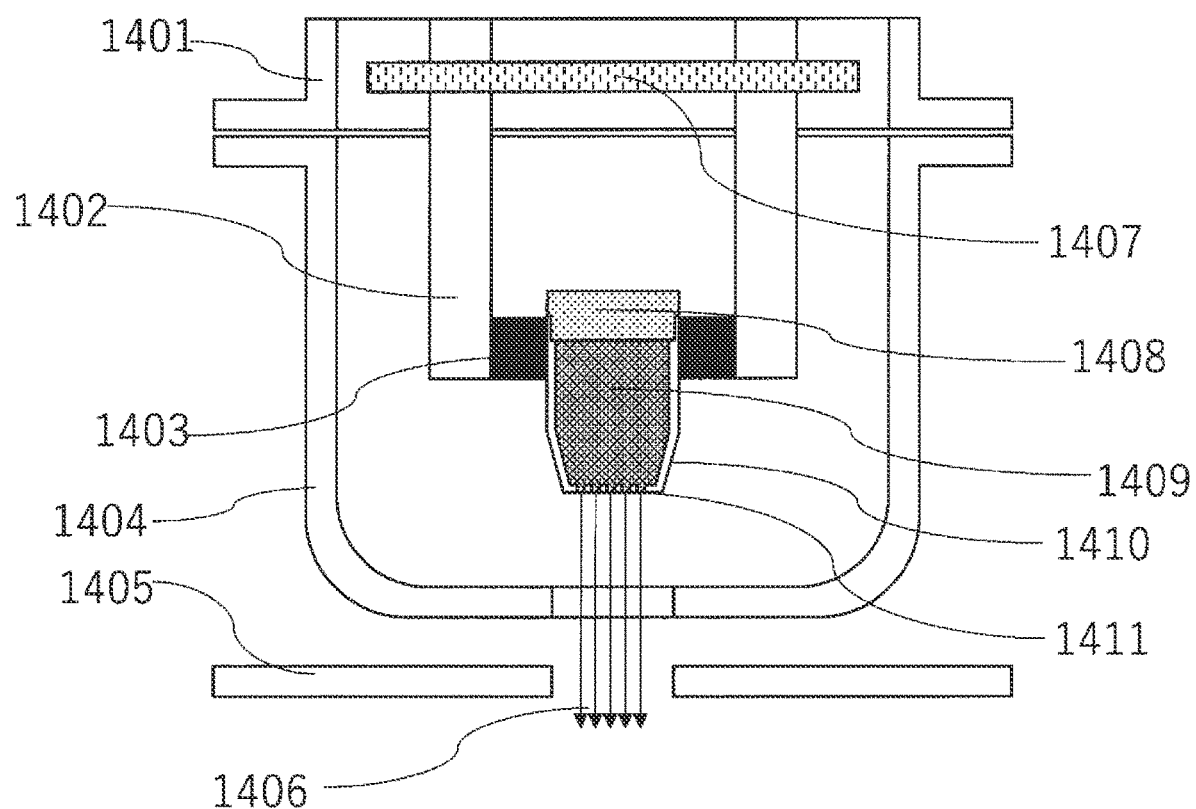
FIG. 12A is an overall view showing an electron gun in which a member having a large number of openings in a thin film is installed on an electron emission surface of a cover tube and a large number of electrons are emitted to form multiple beams.
Figure 12B:
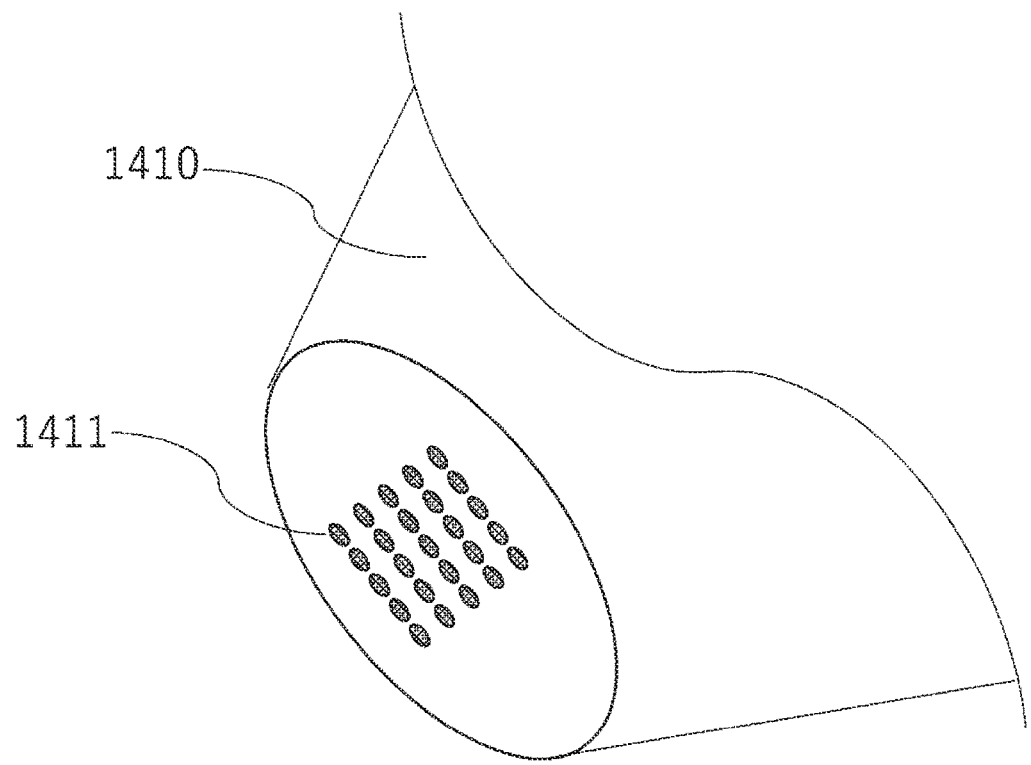
FIG. 12B is a view showing the electron gun in which the member having a large number of openings in the thin film is installed on the electron emission surface of the cover tube and a large number of electrons are emitted to form multiple beams. and is an enlarged view of a top end portion of a multi-electron source.

FIGS. 12A and 12B are views showing an electron gun in which a membrane having many openings in a thin film is installed on an electron emission surface of a cover tube, and a large number of electrons are emitted to form multiple beams. FIG. 12A is an overall view of the electron gun. FIG. 12B is an enlarged view of a top end portion of a multi-electron source.

A multi-beam electron gun is provided with a plate-shaped membrane 1411 formed of a thin high-melting-point conductive material in which a plurality of circles or square holes are opened in an open top end surface of a hollow cover tube container 1410. The lanthanum hydride liquid is exposed to surfaces of all the plurality of circles or square holes. Electrons are emitted in parallel from the exposed lanthanum hydride liquid into the vacuum. A plurality of electron beams 1406 passed through a Wehnelt electrode 1404 and accelerated by an anode 1405 are emitted.

Reference numeral 1401 depicts an upper portion of the electron emission amount controlling Wehnelt electrode, reference numeral 1402 depicts a metal gripper through which a heating current flows, reference numeral 1403 depicts a PG (pyrolytic graphite) heater, reference numeral 1407 depicts a ceramic disk of an electric insulator for fixing the gripper 1402, reference numeral 1408 depicts a back cover of the hollow cover tube container for preventing unnecessary evaporation of the liquid electron emission material, and reference numeral 1409 depicts lanthanum hydride which is the liquid electron emission material.

Figure 13A:
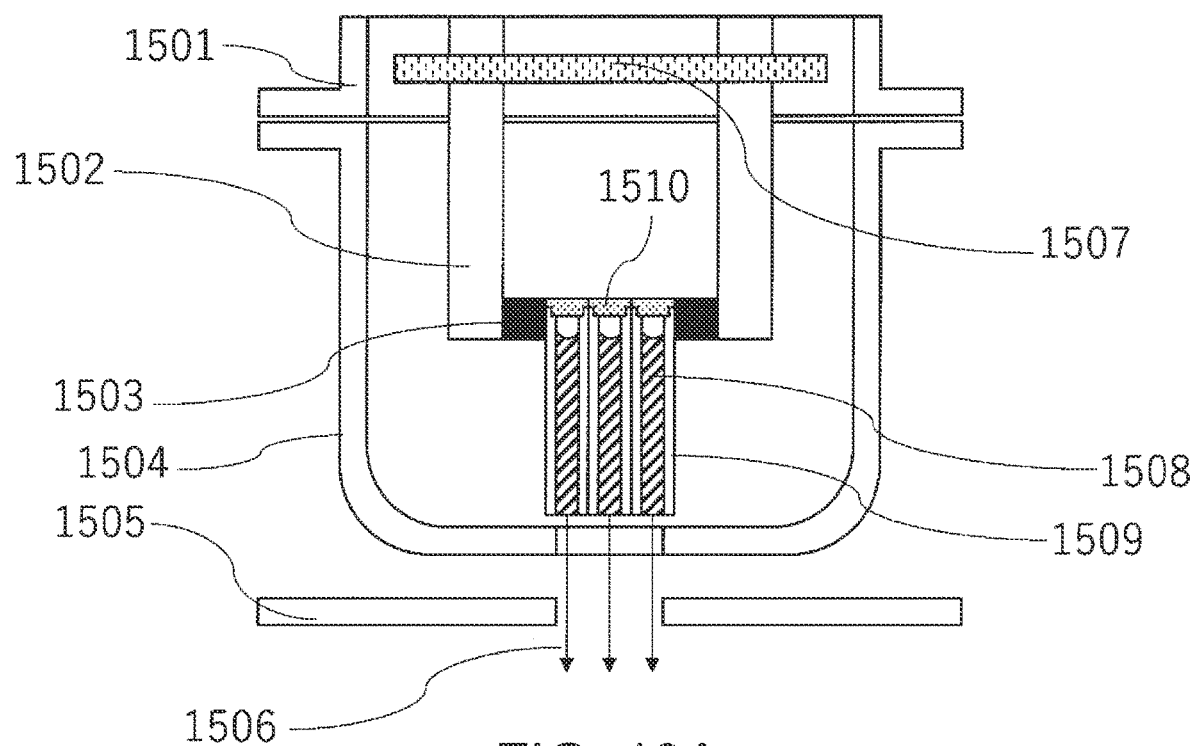
FIG. 13A is an overall view of an electron gun in which an electron emission surface having a required large area is formed by bundling a plurality of hollow cover tube containers as a large number of capillaries when a required electron emission area is large.
Figure 13B:
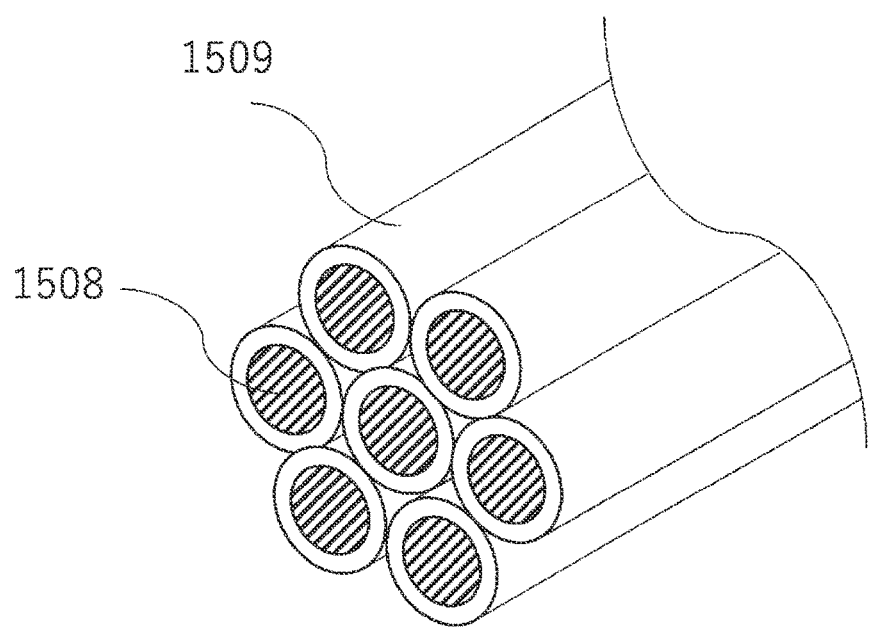
FIG. 13B is an enlarged view of a top end portion in which the electron emission surface having the required large area is formed by bundling the plurality of hollow cover tube containers as the large number of capillaries when the required electron emission area is large.

FIGS. 13A and 13B are schematic views for forming an electron emission surface having a required large area by bundling a plurality of hollow cover tube containers as a large number of capillaries when the required electron emission area is large. FIG. 13A is an overall view of an electron gun. FIG. 13B is an enlarged view of a top end emitter.

A large area cover tube container 1509 formed by bundling (setting a large number tubes to a bundle) a large number of (here, seven) hollow cover tube containers is provided with a lanthanum hydride electron emission liquid material 1508 filled in individual hollow cover tube containers. An electron beam 1506 is emitted from an exposed surface of the lanthanum hydride liquid. A reason why a plurality of fine cover tube containers are bundled without using a large area cover tube container is that an amount of liquid that can be held in a capillary by the capillary phenomenon is limited to a certain amount. That is, since the height of a liquid surface of the capillary phenomenon of the liquid is inversely proportional to a circumferential distance of an inner diameter of a capillary tube, a liquid surface having a smaller capillary tube can be made higher. Also in this method, multiple beams can be formed.

Reference numeral 1501 depicts an upper portion of an electron emission amount controlling Wehnelt electrode, reference numeral 1502 depicts a metal gripper through which a heating current flows, reference numeral 1503 depicts a PG (pyrolytic graphite) heater, reference numeral 1504 depicts a lower portion of an electron emission amount controlling Wehnelt electrode, reference numeral 1505 depicts an anode, reference numeral 1507 depicts a ceramic disk of an electric insulator for fixing the gripper 1502, and reference numeral 1510 depicts a back cover of a hollow cover tube container for preventing unnecessary evaporation of the liquid electron emission material. In this figure, the hollow tube is circular, but it may be square or hexagonal. It may also be a combination of polygons.

Figure 14:
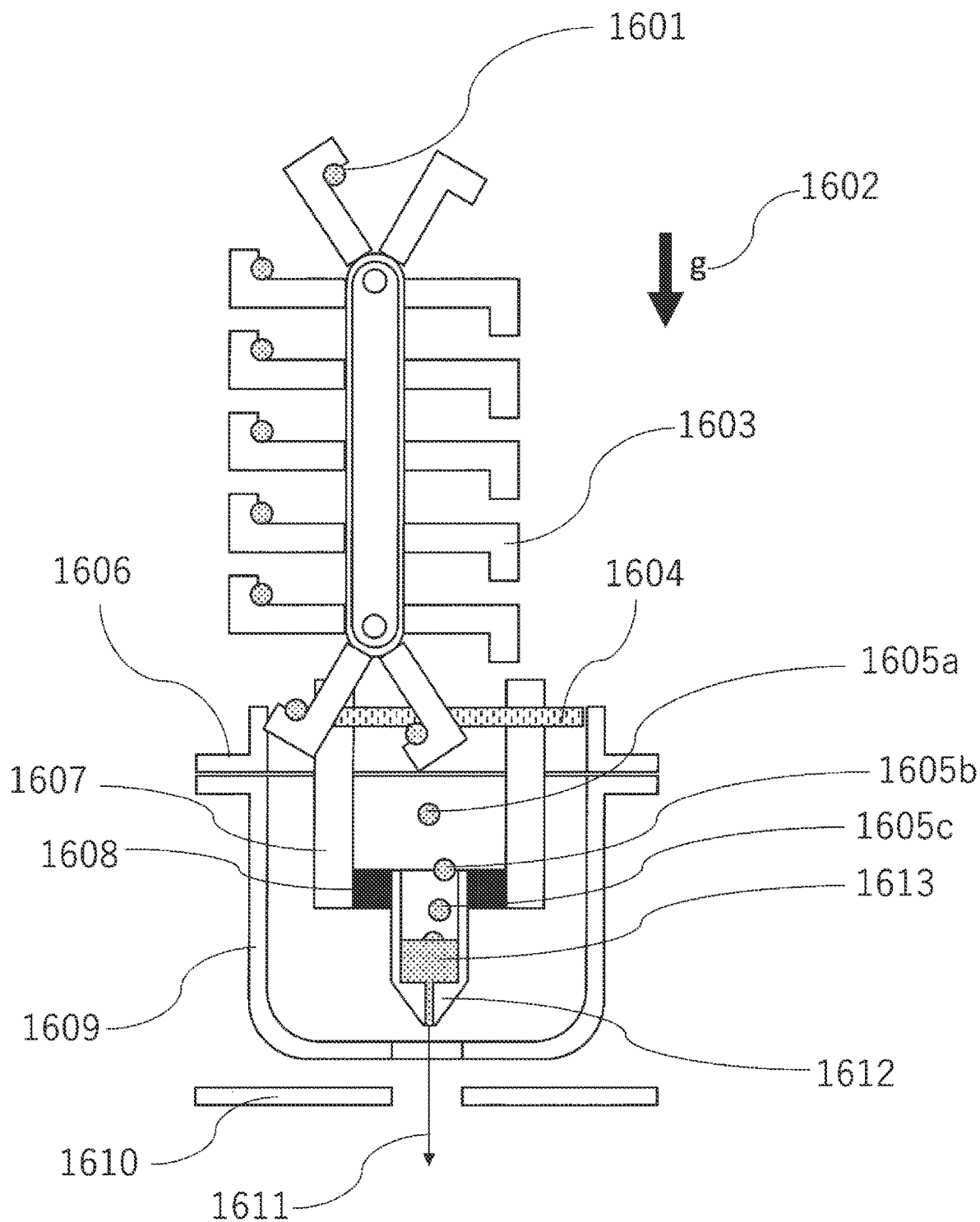
FIG. 14 is a view showing a method for periodically dropping a solid electron emission material into a hollow cover tube container to compensate for consumption of the electron emission material of a liquid electron gun.

FIG. 14 is a view showing a method for periodically dropping a solid electron emission material into a hollow cover tube container to compensate for consumption of the electron emission material of a liquid electron gun.

When a lanthanum hydride liquid electron gun is used for a long period of time, liquid hydrogenated lanthanum 1613 evaporates and the upward liquid surface becomes low. Therefore, it is necessary to compensate by supplying new solid lanthanum hydride 1601. A plurality of granules of solid lanthanum hydrides 1601 fall through an upper surface of a hollow cover tube container one granule at a time by periodic rotation of a belt conveyor of a periodic solid supply mechanism 1603. Reference numerals 1605a, 1605b, 1605c depict fallen granules of solid lanthanum hydrides. The fallen granules of solid lanthanum hydrides are dissolved by touching the liquid hydrogenated lanthanum 1613 heated to the melting point or higher by a PG (pyrolytic graphite) heater 1608. In this manner, a consumption amount of the liquid lanthanum hydride can be compensated.

FIG. 14 is a view for compensating for the solid lanthanum hydride supplied to the cover tube container. In this example, a material of the hydrogenated liquid metal is supplemented in a form of powder, solid, or liquid from a back side or side of an electron beam emission side of the hollow cover tube container. The liquid hydrogenated lanthanum may be supplemented through a pipe that does not come into electrical contact with a back surface of the cover tube container. In FIG. 14, a direction of gravity 1602 faces a falling direction of the solid. The solid lanthanum hydride may be a powder.

Reference numeral 1604 depicts a ceramic disk of an electric insulator for fixing a gripper 1607, reference numeral 1606 depicts an upper portion of an electron emission amount controlling Wehnelt electrode, reference numeral 1607 depicts a metal gripper through which a heating current flows, reference numeral 1609 depicts a lower portion of an electron emission amount controlling Wehnelt electrode, reference numeral 1610 depicts an anode, reference numeral 1611 depicts an electron beam emitted in the direction of gravity, and reference numeral 1612 depicts the hollow cover tube container.

Figure 15A:
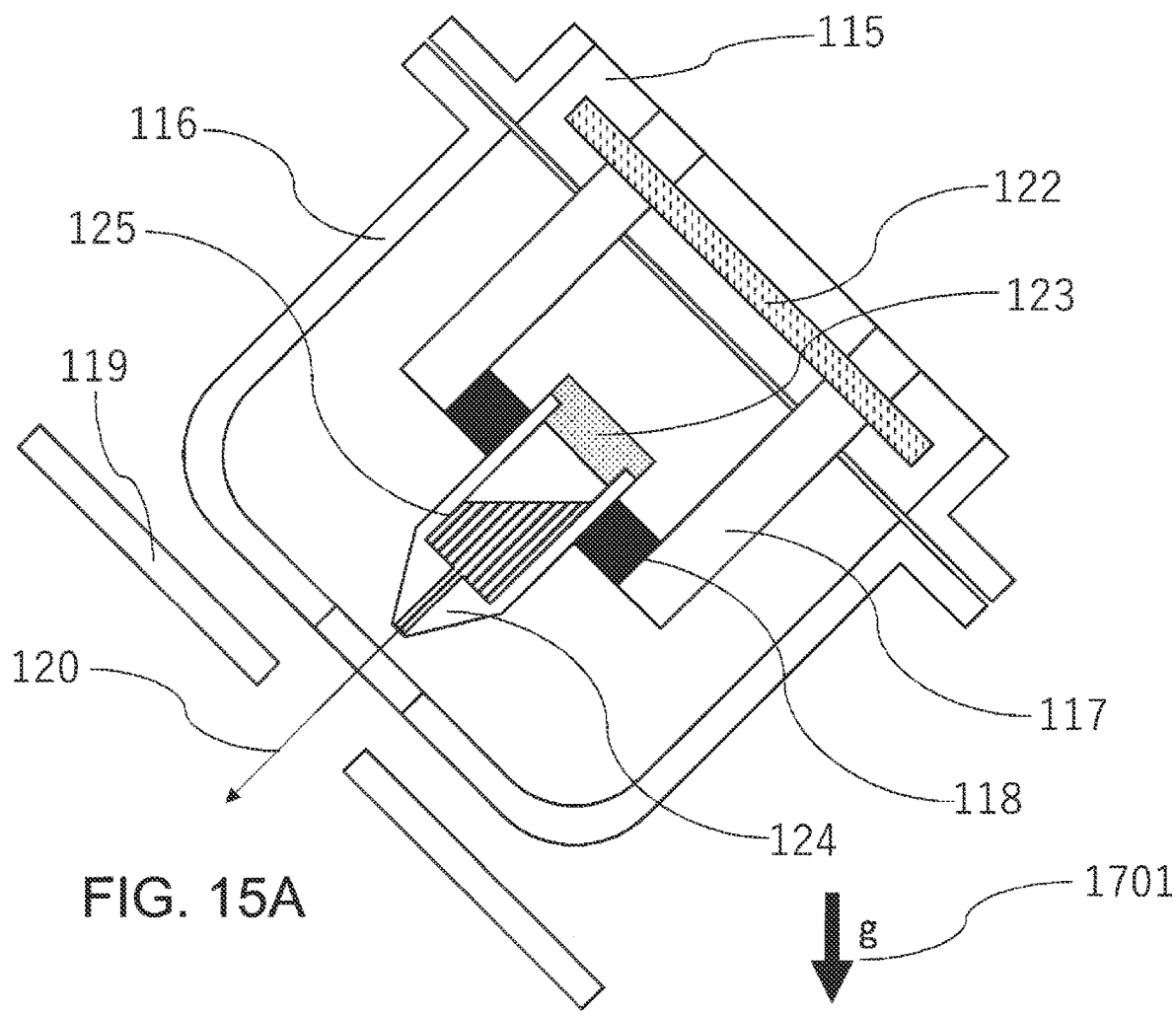
FIG. 15A is an overall view showing a substantial plane of liquid of the liquid electron emission material when the electron gun in the downward direction of gravity is tilted by about 45 degrees, and the liquid surface of emitter hardly changes from a vertical state.
Figure 15B:
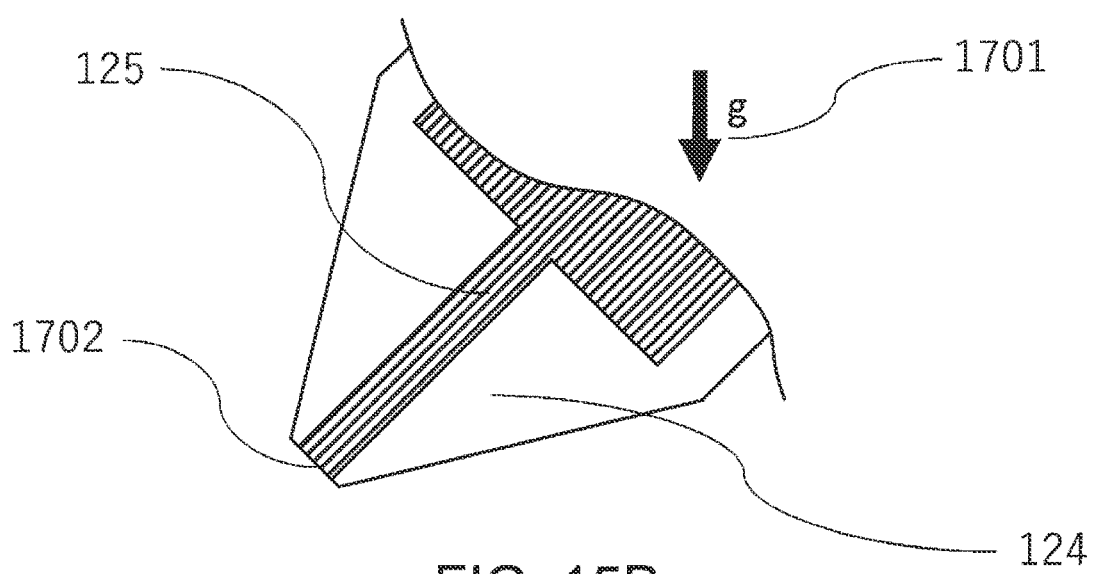
FIG. 15B is an enlarged view of a main part showing a substantially plane of liquid of the liquid electron emission material when the electron gun in the downward direction of gravity is tilted by about 45 degrees, showing that the liquid surface of emitter hardly changes from a vertical state.

In FIGS. 15A and 15B, when an electron gun in the downward direction of gravity (direction of the gravity vector) is inclined at an angle of approximately 45 degrees, an exposed surface of the liquid of the liquid electron emission material is a substantially flat surface 1702. Even if the surface is inclined at 45 degrees, The surface of the lanthanum liquid does not almost change. That is, a surface which is perpendicular to a central axis of a cover tube is maintained at a surface attached to an opening of a side surface of the cover tube by surface tension.

On the other hand, when the hollow cover tube is inclined with respect to gravity, an upper surface of the liquid metal faces the direction of gravity, and the liquid surface is perpendicular to the direction of gravity.

As a result of the balance among gravity, the electric field, and the surface tension at a position of a lower surface of the liquid metal, the lower surface is a flat surface along a top end cross section of the hollow cover tube, that is, a flat surface perpendicular to the axis of the cover tube, because the surface tension is dominant in this case. This remains true until the cover tube is tilted by plus and minus 60 degrees relative to the direction of gravity.

The inventors of the present invention have found that a function of the liquid electron gun is substantially normal if an emission direction of an electron beam is within a range of plus and minus 60 degrees from the direction of gravity 1701 (inside of a cone). Therefore, the electron gun using the liquid electron emission material can be used in a downward direction at plus and minus 60 degrees. 60 degrees can be made large till 85 degrees. However, when the liquid faces a direction perpendicular to the direction of gravity, since the liquid moves in the horizontal direction in the capillary, the exposed surface of the liquid hydrogenated lanthanum is not formed at the top end portion of the cover tube container. In order to prevent this, it is considered necessary to apply pressure in the horizontal direction to the liquid hydrogenated lanthanum.

<Modification>

Although in the present embodiment, the metal material to be hydrogenated is limited to several kinds of elements such as lanthanum and cerium, needless to say, other elements can be used, so long as the elements can be used as the liquid electron emission material in which an electron generation efficiency is significantly large.

In the above description, the liquid lanthanum metal has been used, but the same effect may be replaced with a lanthanoid-based metal such as cerium, gadolinium, terbium, and praseodymium. The hydrogenation of the metal can be realized by flowing hydrogen gas inside the vacuum chamber.

With regard to taking out the electron gun from the vacuum chamber into the atmosphere, when a liquid metal hydride such as lanthanum hydride is taken out into the air after being operated as the electron gun, the liquid metal material may be oxidized by oxygen in the atmosphere. When the liquid metal material is placed in a vacuum and operated again as the electron gun, it is desirable to flow hydrogen gas into the electron gun chamber.

However, this would complicate the design of the device. Accordingly, in the case of lanthanum hydride, natural oxidation can be prevented by covering the surface with a solid lanthanum hydride (LaHx: x=2.8, yellow solid) on the electron emission surface of the cover tube container under a certain condition.

<Zirconium Taylor Cone Electron Gun>

In the related art, there is a liquid electron gun in which zirconium liquid is used as an electron emission surface at a sharp tip end of tungsten by using a liquid surface having a pointed top end called a "Taylor cone". In this electron gun, when a certain period of time passes, zirconium evaporates and disappears, and it is necessary to liquefy the zirconium again. That is, in the present embodiment, a plane perpendicular to the direction of gravity of a stable liquid is used as a high emission electron gun which is stable for a fairly long time. On the other hand, an electron gun of a zirconium liquid using the Taylor cone has a different form, objective, and operation principle compared to the present invention.

<Technique of Fluid Sprayer Applied with Pressure>

There is a technique in which pressure is applied from a rear side of a hollow cover tube container and an electric field is applied to a top end to discharge liquid or gas, and a spray nozzle is used to spray the liquid or gas to form a film and a solid, or to carve and polish a target operation object. This technique is similar to that of the present embodiment.

The spray nozzle has a shape similar to that of the hollow cover tube container according to the present embodiment. However, in the present embodiment, the fluid that applies pressure to the hollow cover tube container does not always flow. In the present embodiment, lanthanum hydride, which is the liquid electron emission material which does not flow at all, is statically held, high luminance electrons are emitted from the electron emission surface to achieve long-term stability, and a field of use and a configuration are completely different. Therefore, there is no means by which a person skilled in the art can easily configure the present invention from the spray nozzle.

[Utilizing Field]

The electron gun according to the present embodiment is much superior compared with an electron gun in the related art and can be used in a normal electron beam writing device to stably carry out electron emission with high luminance and a long lifetime.

In the present embodiment, since the liquid electron gun is used, even if an evaporation material on an electron emission surface at the top end evaporates, a height and a shape of an electron gun flat surface do not change at all, and an electron gun with ultrahigh stability and high accuracy can be formed. This completely overcomes drawbacks of the electron gun in the related art. Therefore, regarding a lifetime of the electron gun in the related art, an extended lifetime can be newly achieved.

Since a lifetime of one year or more can be achieved without carrying out electron gun replacement, an electron gun suitable for a multi-electron beam writing device can be achieved. An X-ray source electron gun can also be used. When the diameter of the top end opening of the cover tube container is 10 µm or less, it can be used as a scanning electron microscope having high luminance and a long lifetime, or as a transmission electron microscope electron gun. In a case of flowing the hydrogen gas, since the electron gun can be used even at a low vacuum level, it can be used as an electron gun in a three-dimensional electron beam welding shaping machine using an electron beam.

If the top end portion of the electron gun cover tube container is sharpened and an opening portion is a minute opening, the top end portion of the cover tube container is preferably used for a drawing device of an ultrafine pattern or an observation electron microscope.

As described above, since the electron gun achieves high luminance and a long lifetime, the electron gun according to the present embodiment, including an electron beam writing device, an electron beam microscope, an electron beam inspection device, an X-ray generator, and the like. greatly contributes to an entire industrial field of an electron beam application device based on the electron gun.

INDUSTRIAL APPLICABILITY

In the electron beam writing device, it is necessary to increase the luminance from one electron gun to 10 times or more that of a LaB6 or a CeB6 electron gun in the related art. A luminance of $10^7$ A/cm$^2$ steradians at 50 kV is required. For this reason, it is necessary to raise a normal usage temperature of 1500° C. of the LaB6 or the CeB6 electron gun in the related art to 1600° C. In this manner, a lifetime of the electron gun is shortened, and the electron gun is sublimated and consumed by about 70 μm in one month. For this reason, it is necessary for the vacuum chamber to be subjected to atmospheric leakage and the electron gun to be replaced at a frequency of about one time in one month. However, the electron gun according to the present embodiment can be operated for one year or more without maintenance, and an electron beam intensity of 10 times or more that in the related art can be achieved. In the electron gun according to the present embodiment, since maintenance time can be set to one day in one year, the maintenance cost can be reduced.

By multi-column and multi-beam with the electron gun according to the present embodiment, it is possible to miniaturize the semiconductor manufacturing from 5 nm to 1 nm. Further, the electron gun according to the present embodiment can be used to construct the semiconductor industry that is a giant industry of future artificial intelligence, such as a brain type computer industry based on artificial intelligence and neuron imitation having a fine pattern by further increasing the integration degree, automatic driving vehicles, various robots including a robot working in a dangerous place, a nursing robot, an interactive co-existing robot, a robot that quickly works large-scale buildings and large-scale construction, and an immortal artificial brain having consciously infinite life that uploads human consciousness, captures human memory consciousness and a thinking process at that point in time, and then lives by taking over the human thinking method and memory.

The electron gun according to the present embodiment can also be used in an X-ray emission device, and play a main role as all X-ray electron guns having a high luminance, a large current, and a long lifetime. The X-ray emission device has a very huge market for use in a hazardous object detection device in transportation facilities and for use in health diagnosis for diagnosing cancer, cerebral hemorrhage, cerebral infarction, and the like. As seen from the above, the electron gun according to the present embodiment contributes as a core of a giant industry of five trillion yen or more.

In the above description, the same members may be assigned different reference numerals and descriptions thereof may be omitted, and the members will be described in the description of the reference numerals.

REFERENCE SIGNS LIST 101 anode
102 hollow cover tube container
103 metal gripper through which heating current flows
104 upper portion of electron emission amount controlling Wehnelt electrode
105 pinion gear
106 lower portion of electron emission amount controlling Wehnelt electrode
107 electron beam emitted in direction opposite or upward to gravity
108 liquid electron emission material
109 direction of gravity
110 PG (pyrolytic graphite) heater
111 piston that operates up and down for keeping height of upward liquid electron emission surface constant
112 support portion of piston 111
113 rack gear that meshes with 105 and moves piston 111 up and down
114 ceramic disk of electric insulator for fixing 103
115 upper portion of electron emission amount controlling Wehnelt electrode
116 lower portion of electron emission amount controlling Wehnelt electrode
117 metal gripper through which heating current flows
118 PG (pyrolytic graphite) heater
119 anode
120 electron beam emitted in direction of gravity
121 direction of gravity
122 ceramic disk of electric insulator for fixing 117
123 back cover of hollow cover tube container for preventing unnecessary evaporation of liquid electron emission material
124 hollow cover tube container
125 liquid electron emission material
201 upper portion of electron emission amount controlling Wehnelt electrode
202 lower portion of electron emission amount controlling Wehnelt electrode
203 metal gripper through which heating current flows
204 PG (pyrolytic graphite) heater
205 anode
206 ceramic disk of electric insulator for fixing 203
207 LaB6 single crystal at start of use
208 electron emission distribution at start of use
209 upper portion of electron emission amount controlling Wehnelt electrode
210 lower portion of electron emission amount controlling Wehnelt electrode
211 metal gripper through which heating current flows
212 PG (pyrolytic graphite) heater
213 anode
214 ceramic disk of electric insulator for fixing 211
215 part of LaB6 crystal sandwiched by heater
216 evaporated substances of LaB6 crystal which is source of temperature reduction by reducing heater resistance value and is deposited on PG (pyrolytic graphite) heater
217 shape of LaB6 single crystal which is sublimated and consumed at high temperature
218 shape of LaB6 single crystal which is not consumed at start of use
219 electron emission distribution after electron emission distribution at start of use is changed by consumption of LaB6 single crystal
220 electron emission distribution at start of use
301 upper portion of electron emission amount controlling Wehnelt electrode
302 lower portion of electron emission amount controlling Wehnelt electrode
303 metal gripper through which heating current flows 304 PG (pyrolytic graphite) heater
305 hollow cover tube container
306 anode
307 ceramic disk of electric insulator for fixing 303
308 direction in which liquid electron emission material evaporates from back surface of cover tube container
309 liquid electron emission material
310 electron beam emitted in direction of gravity
311 upper portion of electron emission amount controlling Wehnelt electrode
312 lower portion of electron emission amount controlling Wehnelt electrode
313 metal gripper through which heating current flows
314 PG (pyrolytic graphite) heater
315 hollow cover tube container
316 anode
317 ceramic disk of electric insulator for fixing 313
318 direction in which liquid electron emission material evaporates from back surface of cover tube container
319 liquid electron emission material which is evaporated as time passes and total liquid amount is reduced
320 electron beam emitted in direction of gravity
401 glass substrate
402 water
403 glass tube
404 water container
405 water
406 upper surface of water surface rising by capillary phenomenon
407 water surface of water container other than glass tube
409 water inside glass tube when glass tube is separated from water container due to capillary phenomenon lowermost surface is substantially flat surface due to surface tension.
410 glass substrate
411 for example, mercury
412 mercury liquid surface other than glass tube
413 mercury container
414 mercury
415 glass tube
416 lowered upper surface of mercury in glass tube
417 glass tube which becomes empty when separated from mercury container. Mercury does not remain in tube by capillary phenomenon in which wettability of mercury is poor in glass tube having contact angle larger than 90 degrees
601 overall view of liquid electron gun
602 electron beam emitted in direction of gravity
603 lanthanum atom which is liquid emission material
604 overall view of liquid electron gun
605 electron beam emitted in direction of gravity
606 hydrogen atom that has entered lanthanum atom liquid
703 emission current characteristic of lanthanum hydride
704 emission current characteristic of LaB6 single crystal
705 emission current characteristic of tungsten
901 overall view of liquid electron gun
902 powder of high temperature photocatalyst for cleaning carbon contamination inside lanthanum liquid, $TiO_2$, or $WO_3$
903 lanthanum hydride which is liquid electron emission material
904 back cover of cover tube container for preventing lanthanum hydride from evaporating from back surface of electron gun emission surface
905 hollow cover tube container
906 overall view of liquid electron gun
907 film of high temperature photocatalyst for cleaning carbon contamination inside lanthanum liquid, $TiO_2$, or $WO_3$
908 lanthanum hydride which is liquid electron emission material
909 back cover of cover tube container for preventing lanthanum hydride from evaporating from back surface of electron gun emission surface
910 hollow cover tube container
1001 lanthanum hydride which is liquid electron emission material
1002 hollow cover tube container
1003 liquid surface of opening at top end of cover tube container from which material of liquid electron gun is exposed to vacuum, forming substantial flat surface or part of spherical surface having large radius by surface tension
1004 electron emission amount controlling Wehnelt electrode
1005a, 1005b metal gripper through which heating current flows
1006a, 1006b PG (pyrolytic graphite) heater
1007 hydrogen gas to be flown into electron gun chamber
1008 electron beam emitted in direction of gravity
1009 ceramic disk of electric insulator for fixing gripper
1010 valve placed between electron gun chamber and turbo molecular pump
1011a, 1011b, 1011c turbo molecular pump
1012 anode as vacuum partition wall between electron gun chamber and downstream second stage column
1013 vacuum partition wall between second stage column and third stage column
1014 roughing dry pump
1015 working substrate which is irradiated with electron beam and subjected to electron beam observation, electron beam drawing, or electron beam welding
1016 third stage column on which electron beam irradiation operation is performed
1017 electron beam deflecting electrode
1018 electron beam converging magnetic field lens
1019 second stage column
1020 hydrogen gas cylinder
1021 hydrogen gas flow rate adjustment mass flow controller
1101 mechanical device for holding hollow cover tube container and moving hollow cover tube container in horizontal direction and vertical direction
1102 hollow cover tube container
1103 crucible or boat for introducing liquid metal
1104 heater power supply for dissolving liquid metal
1105 transmission line from heater power supply to heater for dissolving liquid metal
1106 vacuum chamber for dissolving liquid metal
1107 lanthanum liquid which is liquid metal
1108 vacuum pump
1109 hydrogen gas flow rate adjustment mass flow controller
1110 hydrogen gas cylinder
1111 liquid metal melting heater
1201 ceramic disk of electric insulator for fixing gripper
1202 metal gripper through which heating current flows
1203 PG (pyrolytic graphite) heater
1204 direction of gravity
1205 container for storing lanthanum hydride powder
1206 lanthanum hydride powder stored in hollow cover tube container
1207 hollow cover tube container 1208 lanthanum hydride powder stored in hollow cover tube container
1209 direction of gravity
1210 transmission line from heater power supply to heater for dissolving liquid metal
1211 heater power supply for dissolving liquid metal
1212 lanthanum hydride which is dissolved liquid metal material
1213 vacuum chamber for dissolving liquid metal
1214 vacuum pump
1215 hydrogen gas cylinder
1216 hydrogen gas flow rate adjustment mass flow controller
1217 direction of gravity
1301 hydrogen storage alloy material for further supplying hydrogen in lanthanum hydride which is dissolved liquid metal material
1302 hydrogen molecule absorbed in 1301
1303 hydrogen molecule released from hydrogen storage alloy
1401 upper portion of electron emission amount controlling Wehnelt electrode
1402 metal gripper through which heating current flows
1403 PG (pyrolytic graphite) heater
1404 lower portion of electron emission amount controlling Wehnelt electrode
1405 anode
1406 a plurality of electron beams emitted in parallel
1407 ceramic disk of electric insulator for fixing gripper
1408 back cover of hollow cover tube container for preventing unnecessary evaporation of liquid electron emission material
1409 lanthanum hydride which is liquid electron emission material
1410 hollow cover tube container
1411 membrane formed of thin high-melting-point conductive material in which a plurality of circles or square holes are opened in open top end surface
1501 upper portion of electron emission amount controlling Wehnelt electrode
1502 metal gripper through which heating current flows
1503 PG (pyrolytic graphite) heater
1504 lower portion of electron emission amount controlling Wehnelt electrode
1505 anode
1506 a plurality of electron beams emitted from liquid electron emission material of a plurality of hollow cover tube containers
1507 ceramic disk of electric insulator for fixing gripper
1508 lanthanum hydride which is liquid electron emission material
1509 cover tube container obtained by bundling a plurality of hollow cover tube containers
1510 back cover of hollow cover tube container for preventing unnecessary evaporation of liquid electron emission material
1601 solid lanthanum hydride for compensating periodically to liquid metal electron gun
1602 direction of gravity
1603 mechanism for compensating periodically to liquid metal electron gun
1604 ceramic disk of electric insulator for fixing gripper
1605a, 1605b, 1605c depict fallen granules of solid lanthanum hydrides
1606 upper portion of electron emission amount controlling Wehnelt electrode
1607 metal gripper through which heating current flows
1608 PG (pyrolytic graphite) heater
1609 lower portion of electron emission amount controlling Wehnelt electrode
1610 anode
1611 electron beam emitted in direction of gravity
1612 hollow cover tube container
1613 lanthanum hydride which is liquid electron emission material
1701 direction of gravity
1702 substantially flat surface of liquid of liquid electron emission material when electron gun in downward direction of gravity is inclined at approximately 45 degrees. Almost no change occurs w % ben in vertical direction.

The invention claimed is:

1. An electron gun device configured to emit an electron beam by being heated to a high temperature in vacuum, wherein
a surface of a material that emits the electron beam is a liquid hydrogenated metal dissolved during a high-temperature operation,
the liquid hydrogenated metal is stored as a hydrogenated liquid metal or a liquid metal before hydrogenation in a hollow cover tube container which is solid during a high-temperature operation, is heated to the high temperature together with the cover tube container, and the hydrogenated liquid metal is exposed from the cover tube container to form a liquid surface on which gravity, an electric field, and a surface tension of the liquid surface are balanced, and
the electron beam is emitted from an exposed surface of the hydrogenated liquid metal.

2. The electron gun device according to claim 1, wherein
a surface of the hydrogenated liquid metal emits the electron beam in a range of plus and minus 60 degrees when a normal vector of the surface of the hydrogenated liquid metal faces the direction of gravity or emits the electron beam in a direction opposite to a direction of gravity when a normal vector of the surface of the hydrogenated liquid metal faces the opposite direction of gravity.

3. The electron gun device according to claim 1, wherein the high temperature is 1000° C. or more and 1600° C. or less, and a vapor pressure of the liquid metal to vacuum at the high temperature is $10^{-6}$ pascal to 1 pascal.

4. The electron gun device according to claim 1, wherein when a direction in which the electron beam is emitted is opposite to a direction of gravity, the liquid metal is stored in the hollow cover tube container having an opening in an upper portion, a surface of the liquid metal forms a liquid surface in a direction perpendicular to a forward direction of gravity, and the electron beam is emitted from the liquid surface.

5. The electron gun device according to claim 1, wherein when a direction in which the electron beam is emitted is a forward direction of gravity, the liquid metal is stored in the hollow cover tube container having an opening in a lower portion, a surface of the liquid metal forms a liquid surface in a direction perpendicular to an axis of the cover tube container, and the electron beam is emitted from the liquid surface.

6. The electron gun device according to claim 5, wherein a liquid material that emits the electron beam adheres to an inner wall side surface inside the hollow cover tube container by a capillary phenomenon, an electron emission surface is a lowermost surface facing a direction of gravity, and a surface of the liquid metal which is statically balanced is formed by gravity applied to the liquid metal, an electrostatic force due to a surface electric field by an electrode for extracting electrons, and a surface tension of the liquid metal in the cover tube container, and a thickest part of the cover tube container has a radius of 0.01 mm to 1 mm.

7. The electron gun device according to claim 6, wherein
the hollow cover tube container is formed of a high melting point material having a contact angle of 90 degrees or less with respect to the liquid metal when heated at the high temperature,
the hollow cover tube has a shape of covering a side surface of an electron beam emitting material that faces a direction of a gravity axis,
the hollow cover tube has an external shape that is a prism, a column, or a truncated cone having the direction of gravity as a central axis, and
the hollow cover tube has an internal shape of a hollow cover tube that is a prism, a column, an elliptic cylinder, an oval cylinder, or a truncated cone with the direction of gravity as a central axis.

8. The electron gun device according to claim 7, wherein
a minimum limit value of a capacity of the liquid metal is $4\pi R^3/3$ when R is an average radius of a column or a prism constituting an inner surface of a lowermost portion of the hollow cover tube, that is, a liquid amount is determined to have a capacity equal to or greater than the volume of a sphere that can adhere to the inner surface and no liquid drips from an opening of a lower surface cover tube container, and
a maximum limit value of the capacity of the liquid metal is, when a maximum radius of a cross section, in which an inside of the cover tube container has a largest inner diameter, is defined as r (cm), a contact angle between a cover tube material and the liquid metal material for electron emission is θ (degrees), the surface tension of the liquid metal is γLG (dyne/cm), a liquid metal density is ρ (5 to 10 when density of water is 1), and an acceleration is 980 (g·cm/s²: cgs unit system), set to be smaller than 4/5 of a height h of the liquid metal in the direction of gravity h=2γLG×cos (θ(degrees))/(r× ρ×980) (cm) and no liquid drips from the lowermost surface of the cover tube.

9. The electron gun device according to claim 1, wherein
the liquid metal of the hydrogenated liquid metal includes a lanthanoid series metal, lanthanum, cerium, gadolinium, terbium, or praseodymium.

10. The electron gun device according to claim 9, wherein
a bulk material of the hollow cover tube container is a high melting point metal, tungsten, rhenium, molybdenum, or tantalum, and includes a boride of a metal or a boride of a transition metal as a main component.

11. The electron gun device according to claim 10, wherein
titanium, titanium oxide, tungsten, or an oxide film of tungsten is adhered to an inner surface of the hollow cover tube container, or wherein a powder including titanium, titanium oxide, tungsten, or an oxide of tungsten is mixed into the liquid metal.

12. The electron gun device according to claim 1, wherein
hydrogen gas is flown into a vacuum chamber to maintain vacuum at appropriate time or continuously.

13. The electron gun device according to claim 1, wherein
a surface of the hollow cover tube container opposite to the surface of the hydrogenated liquid metal is covered with a back cover.

14. The electron gun device according to claim 1, wherein
inside the hollow cover tube container, a hydrogen storage alloy that stores a large amount of hydrogen, such as palladium, titanium, zirconium, vanadium, or nickel, is contained in a hollow cover tube as a solid hydrogen storage alloy together with the liquid metal material.

15. The electron gun device according to claim 1, wherein
a plate-shaped member having a large number of holes is provided on a surface of a hollow cover tube on an electron beam emission side, the hydrogenated liquid metal stays inside the holes to form liquid surfaces for emitting electron beams, and a large number of electron beams are simultaneously emitted in parallel.

16. The electron gun device according to claim 1, wherein a plurality of hollow cover tube containers is bundled.

17. The electron gun device according to claim 1, wherein
a material of the hydrogenated liquid metal is supplemented in a form of powder, solid, or liquid from a back side or side facing the surface of the hollow cover tube container on an electron beam emission side.

18. The electron gun device according to claim 9, wherein
the bulk material of the hollow cover tube container includes a single crystal of titanium diboride, zirconium diboride, hafnium diboride, tantalum diboride, or yttrium diboride as a main component.

* * * * *